(12) United States Patent
Burrows et al.

(10) Patent No.: US 8,866,416 B2
(45) Date of Patent: Oct. 21, 2014

(54) ILLUMINATION SOURCE USING LEDS AND OLEDS

(75) Inventors: Paul E. Burrows, Kennewick, WA (US); Michael Hack, Lambertville, NJ (US); Julia J. Brown, Yardley, PA (US)

(73) Assignee: Universal Display Corporation, Ewing, NJ (US)

( * ) Notice: Subject to any disclaimer, the term of this patent is extended or adjusted under 35 U.S.C. 154(b) by 468 days.

(21) Appl. No.: 13/100,452

(22) Filed: May 4, 2011

(65) Prior Publication Data

US 2012/0280631 A1   Nov. 8, 2012

(51) Int. Cl.
  *H05B 37/00*   (2006.01)
  *F21K 99/00*   (2010.01)
  *H01L 51/52*   (2006.01)
  *H01L 27/32*   (2006.01)

(52) U.S. Cl.
  CPC ..... *H01L 27/3225* (2013.01); *H01L 2251/5361* (2013.01); *H01L 51/529* (2013.01); *H01L 27/3211* (2013.01); *Y02B 20/36* (2013.01); *F21K 9/00* (2013.01); *H01L 51/5271* (2013.01); *Y10S 362/80* (2013.01)
  USPC ...... 315/312; 315/294; 362/231; 362/249.02; 362/800

(58) Field of Classification Search
  USPC ......... 315/149–159, 291, 294, 297, 307, 312; 362/231, 234, 240, 253, 79
  See application file for complete search history.

(56) References Cited

U.S. PATENT DOCUMENTS

| | | |
|---|---|---|
| 4,769,292 A | 9/1988 | Tang et al. |
| 5,247,190 A | 9/1993 | Friend et al. |
| 5,703,436 A | 12/1997 | Forrest et al. |
| 5,707,745 A | 1/1998 | Forrest et al. |
| 5,834,893 A | 11/1998 | Bulovic et al. |
| 5,844,363 A | 12/1998 | Gu et al. |
| 6,013,982 A | 1/2000 | Thompson et al. |
| 6,087,196 A | 7/2000 | Sturm et al. |

(Continued)

FOREIGN PATENT DOCUMENTS

| | | |
|---|---|---|
| EP | 1460884 | 9/2004 |
| EP | 2219417 | 8/2010 |
| WO | WO 2008/011724 | 1/2008 |

OTHER PUBLICATIONS

The International Search Report corresponding to the PCT/US2012/036023 Application.

(Continued)

*Primary Examiner* — Thienvu Tran
*Assistant Examiner* — Christopher Lo
(74) *Attorney, Agent, or Firm* — Sterne, Kessler, Goldstein & Fox P.L.L.C.

(57) ABSTRACT

A first device is provided, wherein the first device is an illumination source comprising OLEDs and inorganic LEDs. The first device includes a first light source that has one or more first light emitting devices. Each of the first light emitting devices includes an inorganic light emitting diode (LED) that emits light that has a peak wavelength in the visible spectrum between 400 and 500 nm. The device also includes a second light source that has one or more second light emitting devices. Each of the second light emitting devices comprises an organic light emitting diode (OLED) that emits light that has peak wavelength in the visible spectrum between 500 and 800 nm. The device also includes a driving component. The first light source and the second light source are disposed such that their emissions combine.

19 Claims, 13 Drawing Sheets

(56) References Cited

U.S. PATENT DOCUMENTS

| | | | |
|---|---|---|---|
| 6,091,195 | A | 7/2000 | Forrest et al. |
| 6,097,147 | A | 8/2000 | Baldo et al. |
| 6,294,398 | B1 | 9/2001 | Kim et al. |
| 6,303,238 | B1 | 10/2001 | Thompson et al. |
| 6,337,102 | B1 | 1/2002 | Forrest et al. |
| 6,468,819 | B1 | 10/2002 | Kim et al. |
| 7,279,704 | B2 | 10/2007 | Walters et al. |
| 7,431,968 | B1 | 10/2008 | Shtein et al. |
| 2003/0230980 | A1 | 12/2003 | Forrest et al. |
| 2004/0174116 | A1 | 9/2004 | Lu et al. |
| 2007/0222397 | A1 | 9/2007 | Shiang et al. |
| 2008/0094004 | A1* | 4/2008 | Ackermann ............... 315/294 |
| 2009/0086301 | A1* | 4/2009 | Gally et al. ............... 359/223.1 |
| 2009/0101930 | A1* | 4/2009 | Li ............................... 257/98 |
| 2009/0109435 | A1* | 4/2009 | Kahen et al. ............... 356/317 |
| 2009/0262545 | A1 | 10/2009 | Amelung et al. |
| 2010/0096617 | A1* | 4/2010 | Shanks ....................... 257/13 |
| 2010/0295064 | A1 | 11/2010 | Loebl et al. |

OTHER PUBLICATIONS

Baldo et al., "Highly Efficient Phosphorescent Emission from Organic Electroluminescent Devices," Nature, vol. 395, 151-154, (1998).

Baldo et al., "Very high-efficiency green organic light-emitting devices based on electrophosphorescence," Appl. Phys. Lett., vol. 75, No. 3, 4-6 (1999).

Osram, Oslon SX, Opto Semiconductors: LD CN5M, LT CN5M, Dec. 1, 2009.

\* cited by examiner

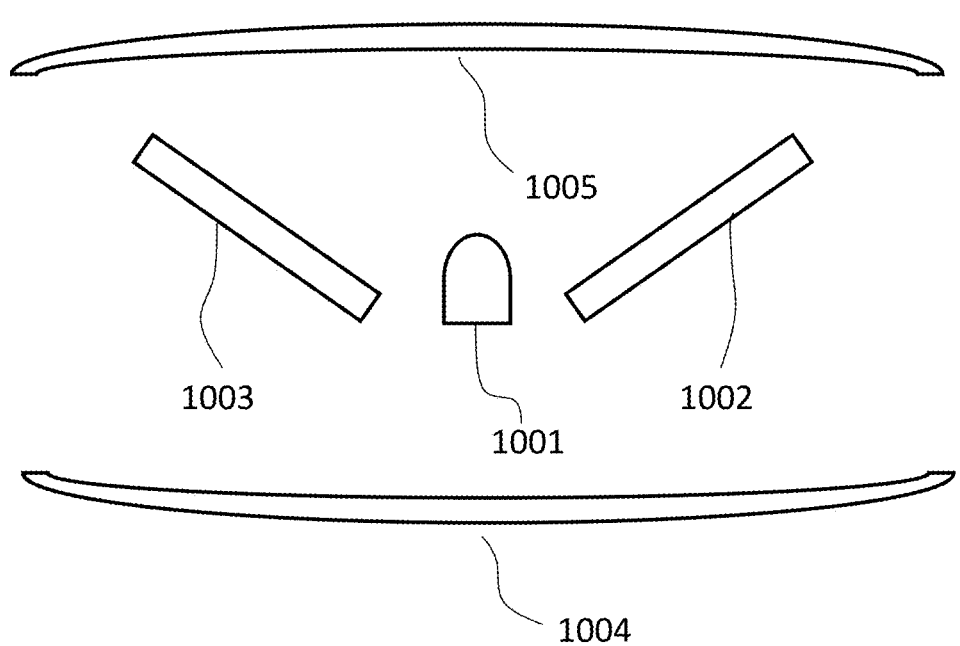

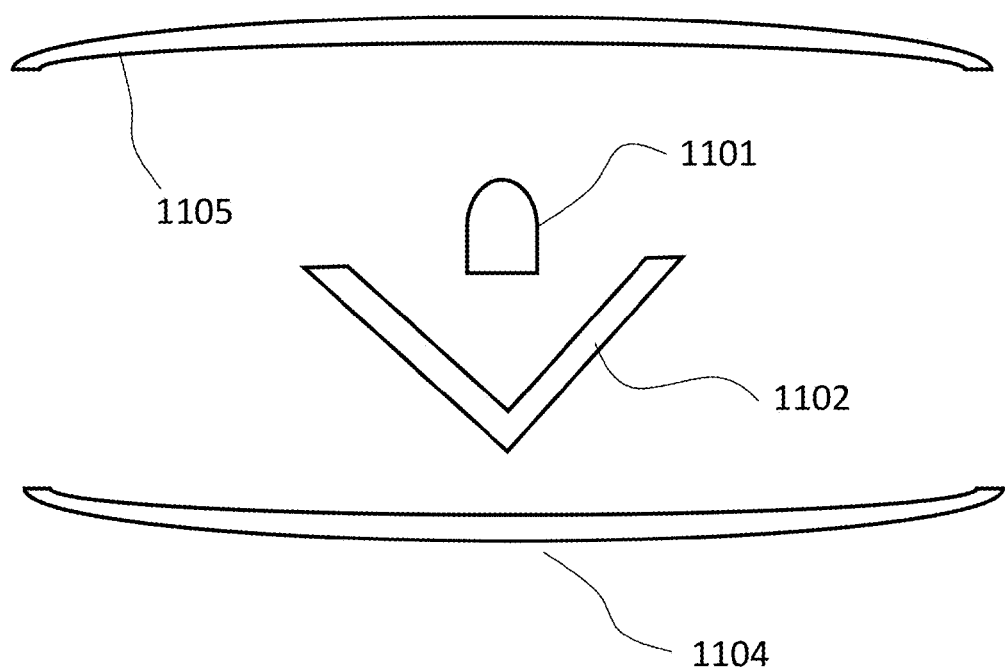

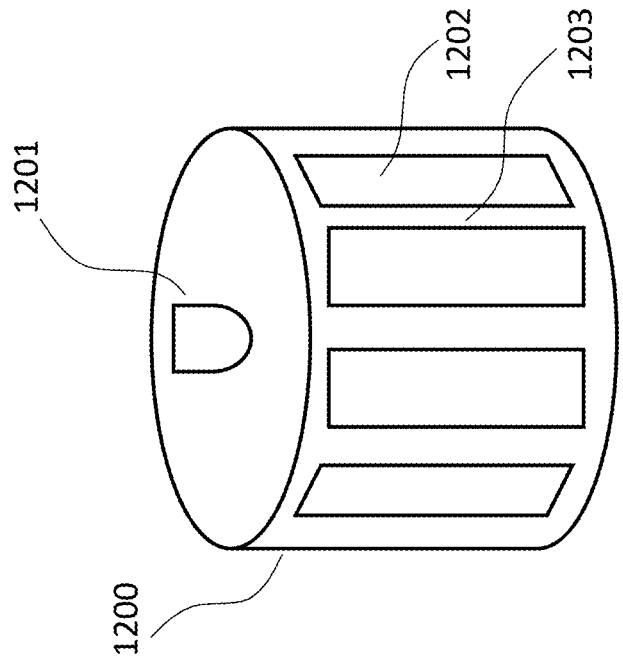
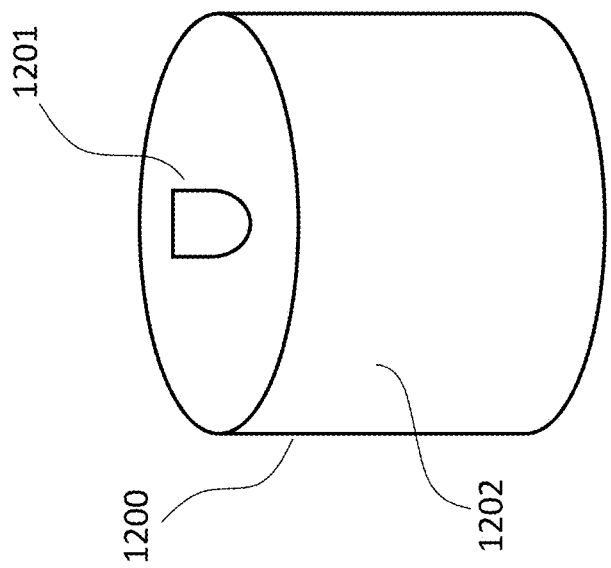

ILLUMINATION SOURCE USING LEDS AND OLEDS

FIELD OF THE INVENTION

The present invention relates to illumination sources using a combination of LEDs and OLEDs.

The claimed invention was made by, on behalf of, and/or in connection with one or more of the following parties to a joint university corporation research agreement: Princeton University, The University of Southern California, The University of Michigan and Universal Display Corporation. The agreement was in effect on and before the date the claimed invention was made, and the claimed invention was made as a result of activities undertaken within the scope of the agreement.

BACKGROUND

Opto-electronic devices that make use of organic materials are becoming increasingly desirable for a number of reasons. Many of the materials used to make such devices are relatively inexpensive, so organic opto-electronic devices have the potential for cost advantages over inorganic devices. In addition, the inherent properties of organic materials, such as their flexibility, may make them well suited for particular applications such as fabrication on a flexible substrate. Examples of organic opto-electronic devices include organic light emitting devices (OLEDs), organic phototransistors, organic photovoltaic cells, and organic photodetectors. For OLEDs, the organic materials may have performance advantages over conventional materials. For example, the wavelength at which an organic emissive layer emits light may generally be readily tuned with appropriate dopants.

OLEDs make use of thin organic films that emit light when voltage is applied across the device. OLEDs are becoming an increasingly interesting technology for use in applications such as flat panel displays, illumination, and backlighting. Several OLED materials and configurations are described in U.S. Pat. Nos. 5,844,363, 6,303,238, and 5,707,745, which are incorporated herein by reference in their entirety.

One application for phosphorescent emissive molecules is a full color display. Industry standards for such a display call for pixels adapted to emit particular colors, referred to as "saturated" colors. In particular, these standards call for saturated red, green, and blue pixels. Color may be measured using CIE coordinates, which are well known to the art.

One example of a green emissive molecule is tris(2-phenylpyridine)iridium, denoted Ir(ppy)3, which has the structure of Formula I:

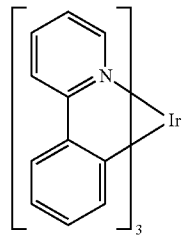

In this, and later figures herein, we depict the dative bond from nitrogen to metal (here, Ir) as a straight line.

As used herein, the term "organic" includes polymeric materials as well as small molecule organic materials that may be used to fabricate organic opto-electronic devices. "Small molecule" refers to any organic material that is not a polymer, and "small molecules" may actually be quite large. Small molecules may include repeat units in some circumstances. For example, using a long chain alkyl group as a substituent does not remove a molecule from the "small molecule" class. Small molecules may also be incorporated into polymers, for example as a pendent group on a polymer backbone or as a part of the backbone. Small molecules may also serve as the core moiety of a dendrimer, which consists of a series of chemical shells built on the core moiety. The core moiety of a dendrimer may be a fluorescent or phosphorescent small molecule emitter. A dendrimer may be a "small molecule," and it is believed that all dendrimers currently used in the field of OLEDs are small molecules.

As used herein, "top" means furthest away from the substrate, while "bottom" means closest to the substrate. Where a first layer is described as "disposed over" a second layer, the first layer is disposed further away from substrate. There may be other layers between the first and second layer, unless it is specified that the first layer is "in contact with" the second layer. For example, a cathode may be described as "disposed over" an anode, even though there are various organic layers in between.

As used herein, "solution processible" means capable of being dissolved, dispersed, or transported in and/or deposited from a liquid medium, either in solution or suspension form.

A ligand may be referred to as "photoactive" when it is believed that the ligand directly contributes to the photoactive properties of an emissive material. A ligand may be referred to as "ancillary" when it is believed that the ligand does not contribute to the photoactive properties of an emissive material, although an ancillary ligand may alter the properties of a photoactive ligand.

As used herein, and as would be generally understood by one skilled in the art, a first "Highest Occupied Molecular Orbital" (HOMO) or "Lowest Unoccupied Molecular Orbital" (LUMO) energy level is "greater than" or "higher than" a second HOMO or LUMO energy level if the first energy level is closer to the vacuum energy level. Since ionization potentials (IP) are measured as a negative energy relative to a vacuum level, a higher HOMO energy level corresponds to an IP having a smaller absolute value (an IP that is less negative). Similarly, a higher LUMO energy level corresponds to an electron affinity (EA) having a smaller absolute value (an EA that is less negative). On a conventional energy level diagram, with the vacuum level at the top, the LUMO energy level of a material is higher than the HOMO energy level of the same material. A "higher" HOMO or LUMO energy level appears closer to the top of such a diagram than a "lower" HOMO or LUMO energy level.

As used herein, and as would be generally understood by one skilled in the art, a first work function is "greater than" or "higher than" a second work function if the first work function has a higher absolute value. Because work functions are generally measured as negative numbers relative to vacuum level, this means that a "higher" work function is more negative. On a conventional energy level diagram, with the vacuum level at the top, a "higher" work function is illustrated as further away from the vacuum level in the downward direction. Thus, the definitions of HOMO and LUMO energy levels follow a different convention than work functions.

More details on OLEDs, and the definitions described above, can be found in U.S. Pat. No. 7,279,704, which is incorporated herein by reference in its entirety.

SUMMARY OF THE INVENTION

A first device is provided, wherein said first device is an illumination source comprising OLEDs and inorganic LEDs.

The first device includes a first light source that has one or more first light emitting devices. Each of the first light emitting devices includes an inorganic light emitting diode (LED) that emits light that has a peak wavelength in the visible spectrum between 400 and 500 nm. The device also includes a second light source that has one or more second light emitting devices. Each of the second light emitting devices comprises an organic light emitting diode (OLED) that emits light that has peak wavelength in the visible spectrum between 500 and 800 nm. The device also includes a driving component. The first light source and the second light source are disposed such that their emissions combine.

Preferably, the first light source and the second light source may be coupled so that the combined emissions have a color rendering index (CRI) of at least 70. More preferably, the first light source and the second light source are coupled such that the combined emissions have a color rendering index (CRI) of at least 80. Preferably, the first light source and the second light source are coupled such that the combined emissions are within a four step MacAdam ellipse of the CIE chromaticity coordinates [0.33, 0.33].

Preferably, the first device is a large area illumination device. Preferably, the smallest of the dimensions that defines the area of the first device is at least 1 cm. More preferably, the smallest of the dimensions that define the area of the first device is at least 6 cm.

In some embodiments, the second light source of the first device as described above includes at least one OLED that emits light that has a peak wavelength in the visible spectrum between 500 and 580 nm. More preferably, the first device does not include any LEDs that emit light that has peak wavelength in the visible spectrum between 500 and 800 nm. Preferably, the first device includes a third light source. The third light source includes one or more third light emitting devices. Each of the third light emitting devices may include one or more OLEDs that emit light that has a peak wave length in the visible spectrum between 580 and 700 nm. More preferably, the first device does not include any LEDs that emit light that has peak wavelength in the visible spectrum between 500 and 800 nm.

In some embodiments, the second light source of the first device as described above includes one or more OLEDs that emit light that has a peak wavelength in the visible spectrum between 550 and 600 nm. More preferably, the first device does not include any LEDs that emit light that has peak wavelength in the visible spectrum between 500 and 800 nm.

In some embodiments, the first device as described above includes a fourth light source. The fourth light source may include one or more fourth light emitting devices. Each of the fourth light emitting devices may include an LED that emits light that has a peak wave length in the visible spectrum between 580 and 700 nm. More preferably, the second light source includes at least one OLED that emits light that has a peak wavelength in the visible spectrum between 500 and 580 nm.

In various embodiments, the first device as described above may comprise a lamp, a fixture, and/or a luminaire. The first device is optionally deformable.

In some embodiments, the first device as described above includes an optical waveguide structure. The optical waveguide structure includes a first surface and a second surface. The first surface is opposed to the second surface. The optical waveguide structure may also include one or more edge surfaces. The first light source may be coupled to the optical waveguide so that the first light source emits light into the optical waveguide structure. At least one of the surfaces of the optical waveguide is a light emitting surface. Preferably, the optical waveguide structure is configured to emit a substantially uniform amount of blue light per unit of surface area of the emitting surfaces. Preferably, the light emitting surface may be further textured so as to improve the outcoupling of light from the second light source.

In some embodiments, in which the first device as described above includes an optical waveguide structure, the second light source includes one or more OLEDs that emit light that has a peak wavelength in the visible spectrum between 500 and 580 nm. More preferably, the first device does not include any inorganic LEDs that emit light that has peak wavelength in the visible spectrum between 500 and 800 nm. Preferably, the first device may include a third light source. The third light source may include one or more third light emitting devices. Each of the third light emitting devices may include one or more OLEDs that emit light that has a peak wave length in the visible spectrum between 580 and 700 nm. More preferably, the first device does not include any inorganic LEDs that emit light that has peak wavelength in the visible spectrum between 500 and 800 nm.

In some embodiments, in which the first device as described above includes an optical waveguide structure, the second light source includes one or more OLEDs that emit light that has a peak wavelength in the visible spectrum between 550 and 600 nm. More preferably, the first device does not include any inorganic LEDs that emit light that has peak wavelength in the visible spectrum between 500 and 800 nm.

In some embodiments, the first device as described above includes an optical waveguide structure and a fourth light source that includes one or more fourth light emitting devices. Each of the fourth light emitting devices may include one or more inorganic LEDs that emit light that has a peak wave length in the visible spectrum between 580 and 700 nm. More preferably, the second light source includes one or more OLEDs that emit light that has a peak wavelength in the visible spectrum between 500 and 580 nm.

In some embodiments, the first device as described above may include an optical waveguide structure and a third light source. The optical waveguide structure includes a first surface and a second surface. The first surface is opposed to the second surface. The optical waveguide structure may also include one or more edge surfaces. The first light source may be coupled to the optical waveguide so that the first light source emits light into the optical waveguide structure. At least one of the surfaces of the optical waveguide is a light emitting surface. Preferably, the optical waveguide structure is configured to emit a substantially uniform amount of blue light per unit of surface area of the emitting surfaces. The third light source may include one or more third light emitting devices. Each of the third light emitting devices may include one or more OLEDs that emit light that has a peak wave length in the visible spectrum between 580 and 700 nm. Preferably, the second light source includes one or more OLEDs that emit light that has a peak wavelength in the visible spectrum between 500 and 580 nm.

Preferably, the second and the third light sources may be disposed over the first surface of the optical waveguide structure and the first light source may be coupled to at least one of the edge surfaces of the optical waveguide structure. Preferably, the second and the third light emitting devices may be disposed such that at least a portion of the emissions from the second and third light sources propagates through the waveguide and is emitted directly from the light emitting surface. More preferably, the light emitted from the second and third light emitting devices propagates directly through the waveguide.

Preferably, the third light source may be disposed over the second light source and the second light source may include one or more transparent organic light emitting diodes (TOLED). More preferably, the second light emitting devices of the second light source are deposited directly onto the first surface of the optical wave guide structure. In some embodiments, the second light emitting devices of the second light source may be deposited on a separate substrate and laminated onto the first surface of the optical waveguide structure.

In some embodiments, the second light source may be disposed over the third light source and the third light source may include one or more TOLED. More preferably, the third light emitting devices of the third light source are deposited directly onto the first surface of the optical wave guide structure. In some embodiments, the third light emitting devices of the third light source may be grown and/or deposited on a separate substrate and laminated onto the first surface of the optical waveguide structure In some embodiments, the first device as described above may include an optical waveguide structure. The optical wave guide structure includes a first surface and a second surface. The first surface is opposed to the second surface. The optical waveguide structure may also include one or more edge surfaces. The first light source may be coupled to the optical waveguide so that the first light source emits light into the optical waveguide structure. At least one of the surfaces of the optical waveguide is a light emitting surface. Preferably, the optical waveguide structure is configured to emit a substantially uniform amount of blue light per unit of surface area of the emitting surfaces. The second light source may be disposed over the first surface of the waveguide structure Preferably, the first light source is coupled to at least one of the edge surfaces of the optical waveguide structure. Preferably, the second light source includes one or more OLEDs that emit light that has a peak wavelength in the visible spectrum between 550 and 600 nm. Preferably, the second light source is disposed such that at least a portion of the emissions from the second light source propagates through the waveguide and is emitted directly from the light emitting surface. More preferably, the light emitted from the second light source passes directly through the waveguide and the emitting surface without any substantial coupling to it. Preferably, the second light emitting devices of the second light source are deposited directly onto the first surface of the optical wave guide structure. In some embodiments, the second light emitting devices of the second light source may be grown and/or deposited on a separate substrate and laminated onto the first surface of the optical waveguide structure. The light emitting surface may be further textured so as to improve the outcoupling of light from the second light source.

In some embodiments, the first device as described above may include an optical wave guide structure and a third light source. The optical wave guide structure includes a first surface and a second surface. The first surface is opposed to the second surface. The optical waveguide structure may also include one or more edge surfaces. The first light source may be coupled to the optical waveguide so that the first light source emits light into the optical waveguide structure. At least one of the surfaces of the optical waveguide is a light emitting surface. Preferably, the optical waveguide structure is configured to emit a substantially uniform amount of blue light per unit of surface area of the emitting surfaces. Preferably, the light emitting surface may be further textured so as to improve the outcoupling of light from the second light source. The third light source may include one or more third light emitting devices. Each of the third light emitting devices may include one or more OLEDs that emit light that has a peak wave length in the visible spectrum between 580 and 700 nm.

Preferably, the second light source of the first device includes one or more OLEDs that emit light that has a peak wavelength in the visible spectrum between 500 and 580 nm. Preferably, the second and the third light sources may be disposed over the first surface of the optical waveguide structure such that at least a portion of the emissions from the second and the third light sources propagates through the waveguide and is emitted directly from the light emitting surface. The second light emitting devices and the third light emitting devices may be disposed over the top surface of the optical waveguide structure so that they are physically segmented from each other. Preferably, the first light source may be disposed on an edge surface of the optical waveguide.

In some embodiments, the first device as described above may include a substrate and a third light source. The third light source may include one or more third light emitting devices. Each of the third light emitting devices may include one or more OLEDs that emit light that has a peak wave length in the visible spectrum between 580 and 700 nm. The second light emitting devices and the third light emitting devices may be directly disposed on a first surface of the substrate. Preferably, the first light source may be disposed on the first surface of the optical waveguide.

In some embodiments, the first device as described above includes an optical waveguide structure and an intervening substrate. The optical wave guide structure includes a first surface and a second surface. The first surface is opposed to the second surface. The optical waveguide structure may also include one or more edge surfaces. The first light source may be coupled to the optical waveguide so that the first light source emits light into the optical waveguide structure. At least one of the surfaces of the optical waveguide is a light emitting surface. Preferably, the optical waveguide structure is configured to emit a substantially uniform amount of blue light per unit of surface area of the emitting surfaces. Preferably, the light emitting surface may be further textured so as to improve the outcoupling of light from the second light source. The intervening substrate may be disposed between the first surface of the optical waveguide structure and the second light source. The second light emitting devices may be coupled to the intervening substrate.

Preferably, the first device may include an optical component. Preferably, the optical component may be disposed between the first surface of the waveguide structure and the intervening substrate. More preferably, the optical component may include any one of, or some combination of, the following: an air space; a partial reflector; an index-matching fluid or solid layer; a diffuser; and/or an outcoupler.

In some embodiments, where the first device as described above includes an optical waveguide structure, the second light source may include one or more TOLEDs. Preferably, at least some of the light that is emitted from the second light source propagates away from the waveguide. More preferably, at least a portion of the light emitted from the first light source propagates through the second light source. The optical waveguide structure includes a first surface and a second surface. The first surface is opposed to the second surface. The optical waveguide structure may also include one or more edge surfaces. The first light source may be coupled to the optical waveguide so that the first light source emits light into the optical waveguide structure. At least one of the surfaces of the optical waveguide is a light emitting surface. Preferably, the optical waveguide structure is configured to emit a substantially uniform amount of blue light per unit of surface area of the emitting surfaces. Preferably, the light emitting surface may be further textured so as to improve the outcoupling of light from the second light source.

Preferably, the second light source is disposed over the first surface of the waveguide. More preferably, the first surface of the waveguide is a light emitting surface. Preferably, the second surface of the waveguide may comprise a reflector. Alternatively, the second surface of the waveguide may comprise a light emitting surface such that a portion of the light emitted from the first and the second light sources passes through the second surface. Preferably, the first device may include a third light source that is disposed over the first surface of the waveguide structure. More preferably, the second and third light sources may comprise one or more TOLEDs. The second and third light sources may be disposed such that at least a portion of the light emitted from the first light source propagates through the second and third light source.

In some embodiments, the first device as described above includes a third light source, where the third light source includes one or more third light emitting devices, and each of the third light emitting devices may include one or more OLEDs that emit light that has a peak wave length in the visible spectrum between 580 and 700 nm. The first device may further include a first substrate and a second substrate. The second light source may be disposed on the first substrate, the third light source may be disposed on the second substrate, and the first light source may not be disposed on the first or the second substrate. Preferable, the first device may also include either one of, or some combination of a lens; and a reflector. More preferably, the first device may comprise both a lens and a reflector, where the first, the second, and the third light sources are disposed between the lens and the reflector.

In some embodiments, the first device as described above includes a first substrate. The second light source may be disposed on the first substrate, and the first light source may not be disposed on the first substrate. Preferably, the first light source is disposed at a location that is in the propagation direction of light emitted from the second light source.

In some embodiments, the first device as described above includes a substrate. The substrate may substantially surrounds the first light source. Preferably, the substrate surrounds the first light source. Preferably, the second light source is disposed on a surface of the substrate. Preferably, the substrate is a patterned substrate and the second light source includes one or more TOLEDs.

In some embodiments, the first device as described above includes a heat protective element. The heat protective element of the first device may be configured to reduce the amount of heat generated by the first light source that reaches the second light source. Preferably, the heat protective element is configured to significantly reduce the amount of heat generated by the first light source that reaches the second light source. In some embodiments, the heat protective element includes a dielectric reflector. The dielectric reflector may be coupled to the first light emitting devices of the first light source such that the light emitted from the first light emitting devices propagates through at least a portion of the dielectric reflector. In some embodiments, the heat protective element may include cooling fins. In some embodiments, the heat protective element may include an active heat removal device. The active heat removal device is configured to remove heat away from the second light emitting devices. In some embodiments, the active heat removal device comprises either one of, or some combination of thermoelectric coolers and/or a forced fluid cooling system.

In some embodiments, the heat distribution element of the first device is configured to distribute heat evenly over the surfaces of the OLEDs of the first device. Preferably, the heat distribution element is configured to distribute heat so as to maintain a substantially uniform current injection in the OLED devices.

In some embodiments, the driving component of the first device as described above is configured to independently control the current supplied to at least one OLED and at least one LED in response to a single input. Preferably, the current supplied to the OLED and the LED is not linearly related. In some embodiments, the input may have at least three different levels. In some embodiments, the input may be continuously variable.

In some embodiments of the first devices as described above where the driving component is configured to independently control the current supplied to at least one OLED and at least one LED in response to a single input, the driving component may also be configured to control the current supplied to the LED and OLED such that the combined light emissions of the first device maintain a constant CIE coordinate for all levels of input. In some embodiments, the driving component is configured to control the current supplied to the LED and OLED so as to maintain a color correlated temperature (CCT) for the combined light emissions of the first device as the brightness of the first device is varied. In some embodiments, the driving component is configured to control the current supplied to the LED and OLED such that the combined light emissions of the first device has a CIE coordinate that moves along the CCT line as the input varies. In some embodiments, the driving component is configured to control the current supplied by using any one of, or some combination of circuitry, a look-up table; and application-specific integrated circuits (ASIC).

In some embodiments, the first device as described above may comprise a plurality of separate driving components that control the current supplied to the LEDs and the OLEDs. In some embodiments, the driving components may use circuitry, a look-up table, and/or application-specific integrated circuit (ASIC) to control the current supply to the OLEDs and LEDs for the first device. In some embodiments, a plurality of OLEDs may be electrically connected in series and controlled by a driving component. In some embodiments, the driving components control the current to the OLEDs and/or LEDs of the first device such that the CCT of the combined light source decreases as the total light output is reduced. In some embodiments, at least one LED and one OLED are electrically connected in series and the current supplied to each is controlled by a single electronic driving component.

In some embodiments, the driving component or components of the first device as described above are configured to determine any one of, or some combination of a luminance level of the first device and/or a CCT value of the first device. Preferably, the driving component or components are configured to provide an amount of current to the first and/or the second light sources based on either one of, or some combination of the determined luminance level and/or the determined CCT value.

In some embodiments, the second light source of the first device as described above may comprise a plurality of OLED devices. The first device may comprise a first set of OLED devices that includes a portion of the plurality of OLED devices. Each of the OLED devices in the first set of OLED devices may be electrically connected in parallel. The first device may also include a second set of OLED devices that includes a portion of the plurality of OLED devices. Each of the OLED devices in the second set of OLED devices may also be electrically connected in parallel. The first set and the second set of OLED devices may be electrically connected in series such that the first set and the second set of OLED devices are controlled by one driving component.

BRIEF DESCRIPTION OF THE DRAWINGS

FIG. 10 shows an exemplary embodiment of a first device that utilizes light sources on separate substrates.

FIG. 11 shows an exemplary embodiment of a first device that utilizes light sources on separate substrates.

FIGS. 12 (a) and (b) show exemplary embodiments of a first device.

DETAILED DESCRIPTION

Generally, an OLED comprises at least one organic layer disposed between and electrically connected to an anode and a cathode. When a current is applied, the anode injects holes and the cathode injects electrons into the organic layer(s). The injected holes and electrons each migrate toward the oppositely charged electrode. When an electron and hole localize on the same molecule, an "exciton," which is a localized electron-hole pair having an excited energy state, is formed. Light is emitted when the exciton relaxes via a photoemissive mechanism. In some cases, the exciton may be localized on an excimer or an exciplex. Non-radiative mechanisms, such as thermal relaxation, may also occur, but are generally considered undesirable.

The initial OLEDs used emissive molecules that emitted light from their singlet states ("fluorescence") as disclosed, for example, in U.S. Pat. No. 4,769,292, which is incorporated by reference in its entirety. Fluorescent emission generally occurs in a time frame of less than 10 nanoseconds.

More recently, OLEDs having emissive materials that emit light from triplet states ("phosphorescence") have been demonstrated. Baldo et al., "Highly Efficient Phosphorescent Emission from Organic Electroluminescent Devices," Nature, vol. 395, 151-154, 1998; ("Baldo-I") and Baldo et al., "Very high-efficiency green organic light-emitting devices based on electrophosphorescence," Appl. Phys. Lett., vol. 75, No. 3, 4-6 (1999) ("Baldo-II"), which are incorporated by reference in their entireties. Phosphorescence is described in more detail in U.S. Pat. No. 7,279,704 at cols. 5-6, which are incorporated by reference.

Figure 1:
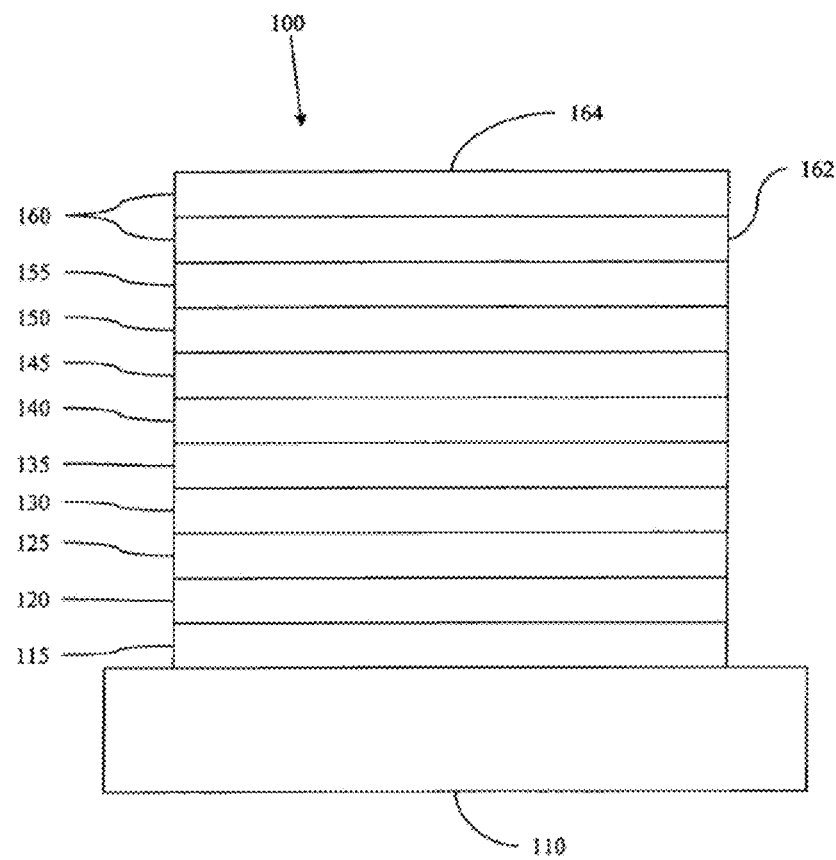
FIG. 1 shows an organic light emitting device.

FIG. 1 shows an organic light emitting device 100. The Figures are not necessarily drawn to scale. Device 100 may include a substrate 110, an anode 115, a hole injection layer 120, a hole transport layer 125, an electron blocking layer 130, an emissive layer 135, a hole blocking layer 140, an electron transport layer 145, an electron injection layer 150, a protective layer 155, and a cathode 160. Cathode 160 is a compound cathode having a first conductive layer 162 and a second conductive layer 164. Device 100 may be fabricated by depositing the layers described, in order. The properties and functions of these various layers, as well as example materials, are described in more detail in U.S. Pat. No. 7,279,704 at cols. 6-10, which are incorporated by reference.

More examples for each of these layers are available. For example, a flexible and transparent substrate-anode combination is disclosed in U.S. Pat. No. 5,844,363, which is incorporated by reference in its entirety. An example of a p-doped hole transport layer is m-MTDATA doped with $F_4$-TCNQ at a molar ratio of 50:1, as disclosed in U.S. Patent Application Publication No. 2003/0230980, which is incorporated by reference in its entirety. Examples of emissive and host materials are disclosed in U.S. Pat. No. 6,303,238 to Thompson et al., which is incorporated by reference in its entirety. An example of an n-doped electron transport layer is BPhen doped with Li at a molar ratio of 1:1, as disclosed in U.S. Patent Application Publication No. 2003/0230980, which is incorporated by reference in its entirety. U.S. Pat. Nos. 5,703,436 and 5,707,745, which are incorporated by reference in their entireties, disclose examples of cathodes including compound cathodes having a thin layer of metal such as Mg:Ag with an overlying transparent, electrically-conductive, sputter-deposited ITO layer. The theory and use of blocking layers is described in more detail in U.S. Pat. No. 6,097,147 and U.S. Patent Application Publication No. 2003/0230980, which are incorporated by reference in their entireties. Examples of injection layers are provided in U.S. Patent Application Publication No. 2004/0174116, which is incorporated by reference in its entirety. A description of protective layers may be found in U.S. Patent Application Publication No. 2004/0174116, which is incorporated by reference in its entirety.

Figure 2:
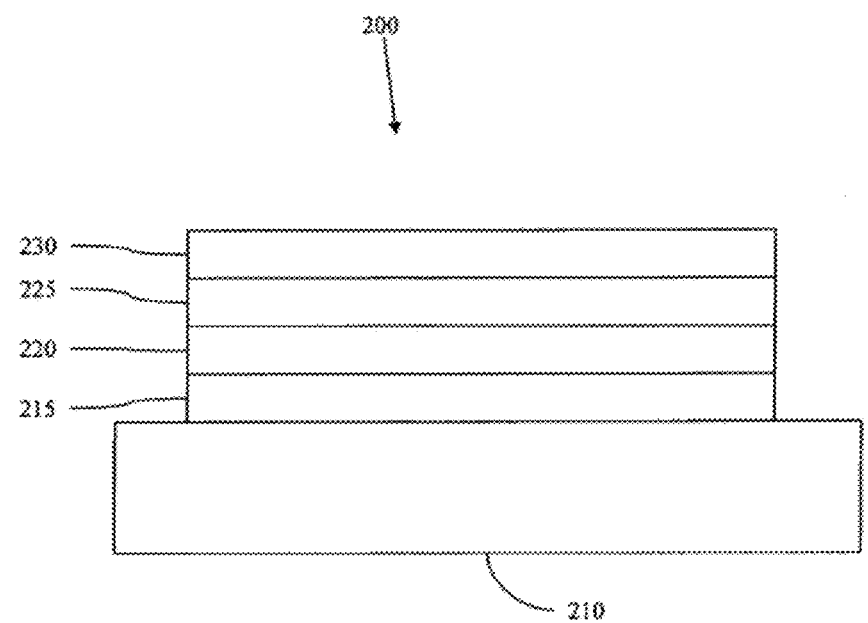
FIG. 2 shows an inverted organic light emitting device that does not have a separate electron transport layer.

FIG. 2 shows an inverted OLED 200. The device includes a substrate 210, a cathode 215, an emissive layer 220, a hole transport layer 225, and an anode 230. Device 200 may be fabricated by depositing the layers described, in order. Because the most common OLED configuration has a cathode disposed over the anode, and device 200 has cathode 215 disposed under anode 230, device 200 may be referred to as an "inverted" OLED. Materials similar to those described with respect to device 100 may be used in the corresponding layers of device 200. FIG. 2 provides one example of how some layers may be omitted from the structure of device 100.

The simple layered structure illustrated in FIGS. 1 and 2 is provided by way of non-limiting example, and it is understood that embodiments of the invention may be used in connection with a wide variety of other structures. The specific materials and structures described are exemplary in nature, and other materials and structures may be used. Functional OLEDs may be achieved by combining the various layers described in different ways, or layers may be omitted entirely, based on design, performance, and cost factors. Other layers not specifically described may also be included. Materials other than those specifically described may be used. Although many of the examples provided herein describe various layers as comprising a single material, it is understood that combinations of materials, such as a mixture of host and dopant, or more generally a mixture, may be used. Also, the layers may have various sublayers. The names given to the various layers herein are not intended to be strictly limiting. For example, in device 200, hole transport layer 225 transports holes and injects holes into emissive layer 220, and may be described as a hole transport layer or a hole injection layer. In some embodiments, an OLED may be described as having an "organic layer" disposed between a cathode and an anode. This organic layer may comprise a single layer, or may further comprise multiple layers of different organic materials as described, for example, with respect to FIGS. 1 and 2.

Structures and materials not specifically described may also be used, such as OLEDs comprised of polymeric materials (PLEDs) such as disclosed in U.S. Pat. No. 5,247,190 to Friend et al., which is incorporated by reference in its entirety. By way of further example, OLEDs having a single organic layer may be used. OLEDs may be stacked, for example as described in U.S. Pat. No. 5,707,745 to Forrest et al, which is incorporated by reference in its entirety. The OLED structure may deviate from the simple layered structure illustrated in FIGS. 1 and 2. For example, the substrate may include an angled reflective surface to improve out-coupling, such as a mesa structure as described in U.S. Pat. No. 6,091,195 to Forrest et al., and/or a pit structure as described in U.S. Pat. No. 5,834,893 to Bulovic et al., which are incorporated by reference in their entireties.

Unless otherwise specified, any of the layers of the various embodiments may be deposited by any suitable method. For the organic layers, preferred methods include thermal evaporation, ink-jet, such as described in U.S. Pat. Nos. 6,013,982 and 6,087,196, which are incorporated by reference in their entireties, organic vapor phase deposition (OVPD), such as described in U.S. Pat. No. 6,337,102 to Forrest et al., which is incorporated by reference in its entirety, and deposition by organic vapor jet printing (OVJP), such as described in U.S. patent application Ser. No. 10/233,470, which is incorporated by reference in its entirety. Other suitable deposition methods include spin coating and other solution based processes. Solution based processes are preferably carried out in nitrogen or an inert atmosphere. For the other layers, preferred methods include thermal evaporation. Preferred patterning methods include deposition through a mask, cold welding such as described in U.S. Pat. Nos. 6,294,398 and 6,468,819, which are incorporated by reference in their entireties, and patterning associated with some of the deposition methods such as ink jet and OVJD. Other methods may also be used. The materials to be deposited may be modified to make them compatible with a particular deposition method. For example, substituents such as alkyl and aryl groups, branched or unbranched, and preferably containing at least 3 carbons, may be used in small molecules to enhance their ability to undergo solution processing. Substituents having 20 carbons or more may be used, and 3-20 carbons is a preferred range. Materials with asymmetric structures may have better solution processability than those having symmetric structures, because asymmetric materials may have a lower tendency to recrystallize. Dendrimer substituents may be used to enhance the ability of small molecules to undergo solution processing.

Devices fabricated in accordance with embodiments of the invention may be incorporated into a wide variety of consumer products, including flat panel displays, computer monitors, televisions, billboards, lights for interior or exterior illumination and/or signaling, heads up displays, fully transparent displays, flexible displays, laser printers, telephones, cell phones, personal digital assistants (PDAs), laptop computers, digital cameras, camcorders, viewfinders, micro-displays, vehicles, a large area wall, theater or stadium screen, or a sign. Various control mechanisms may be used to control devices fabricated in accordance with the present invention, including passive matrix and active matrix. Many of the devices are intended for use in a temperature range comfortable to humans, such as 18 degrees C. to 30 degrees C., and more preferably at room temperature (20-25 degrees C.).

The materials and structures described herein may have applications in devices other than OLEDs. For example, other optoelectronic devices such as organic solar cells and organic photodetectors may employ the materials and structures. More generally, organic devices, such as organic transistors, may employ the materials and structures.

The terms halo, halogen, alkyl, cycloalkyl, alkenyl, alkynyl, arylkyl, heterocyclic group, aryl, aromatic group, and heteroaryl are known to the art, and are defined in U.S. Pat. No. 7,279,704 at cols. 31-32, which are incorporated herein by reference.

As used herein, "red" means having a peak wavelength in the visible spectrum between 580 and 700 nm, "green" means having a peak wavelength in the visible spectrum between 500 and 580 nm, "blue" means having a peak wavelength in the visible spectrum between 400 and 500 nm, and "yellow" means having a peak wavelength in the visible spectrum between 550 and 600 nm. We note that while the peak wavelength is a good proxy for color that persons of skill the art often use, these are not exact descriptions of the color due to variations in the spectrum away from the peak and thus the overlap in the ranges provided between "yellow" and "red" and/or "green" is reasonable. "White" means light emissions that have a color rendering index (CRI) of at least 70 and/or light emission that are within a four step MacAdam ellipse of the CIE chromaticity coordinates [0.33, 0.33].

The color difference between different devices can be described by MacAdam Ellipses, which are a well-known measure of human ability to differentiate color. A MacAdam Ellipse is a region on a CIE diagram inside of which a particular number of humans can not differentiate between colors. At a distance of one "step," from a target CIE coordinate, 68% of people can perceive a color difference. 68% is the percentage that falls within one standard deviation on a bell curve. At a distance of two steps, 95% of people can perceive a color difference, where 95% is the percentage that falls within two standard deviations on a bell curve, and so on. The lighting industry generally desires that the color of a light used for illumination be reproducible within a 3- or 4-step MacAdam ellipse. If color reproducibility is too low, a viewer looking at two sources of illumination would perceive significant differences. For example, the different panels of a ceiling light might appear to have different colors, or there might be a significantly perceivable variation within a panel, which is undesirable.

Figure 3:
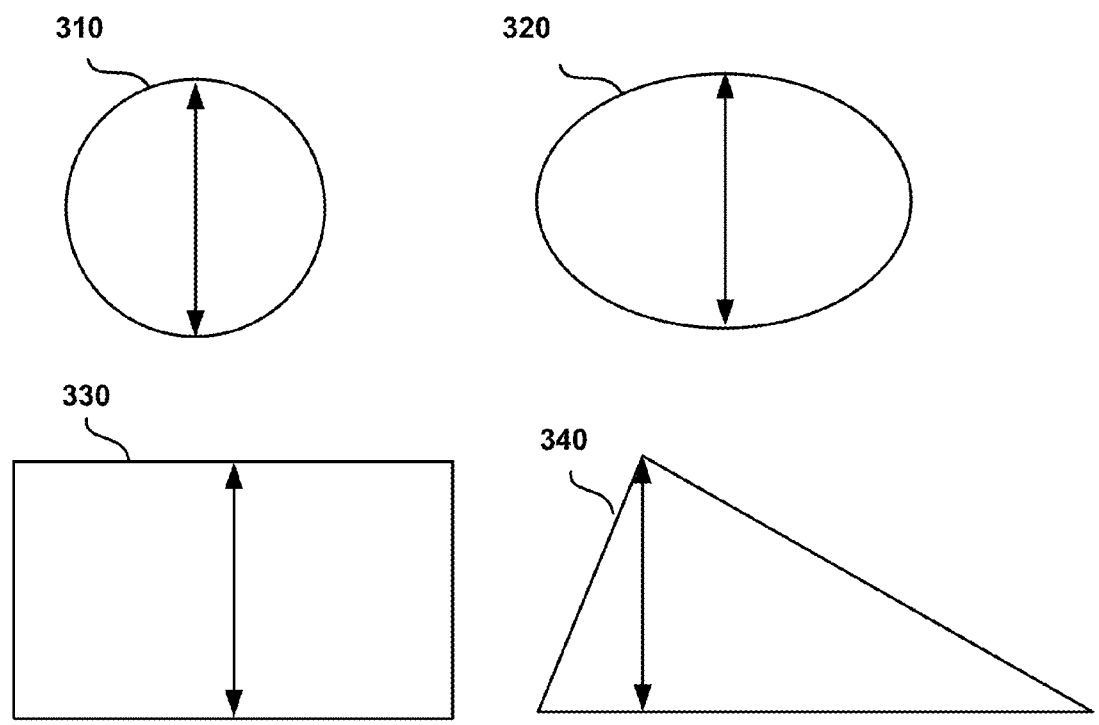
FIG. 3 shows cross sections of four different geometries of a first device taken in a direction perpendicular to light emission.

FIG. 3 shows cross sections of four geometries representing the surface of a device for emitting light. In some embodiments, light is emitted from the surface in a direction that is substantially perpendicular to the surface. The arrow in each of the areas represents the "smallest linear dimension" of the area of the first device. In mathematical terms, at the smallest dimension, the arrow length is either at a local maximum (for the circle, oval and triangle) or is constant (for the rectangle) with respect to translation of the whole arrow in a direction perpendicular to the arrow, and the "smallest" dimension is the smallest local maximum or constant for which this occurs. FIG. 3 shows cross sections of areas 310, 320, 330 and 340 having circular, oval, rectangular and triangular cross sections, respectively. A rectangular area is the most preferred shape for illumination devices, as it is relatively inexpensive and efficient to manufacture on a large scale. However, as contemplated here within, any other shape may be used for the area through which light is substantially propagated.

A limitation of OLED illumination sources is the efficiency and operating lifetime of light emitting devices that have peak wave lengths in the blue light spectrum. Conversely, inorganic LEDs that emit blue light are very efficient, which are often based on InGaN hetero junction materials, although other materials can be used such as ZnO, AlInGaN, AlGaInP, GaAsP, GaInP etc. In contrast, the more efficient and longer lived OLED devices have for many years been those emitting green and red light. These OLED devices are typically based on the well-studied iridium chelate phosphorescent systems. Conversely, the least efficient inorganic LEDs are usually those that emit green light because typically a higher proportion of In must be incorporated in the device to shrink the GaN band gap into the green spectral region. There is still controversy in the field as to the science behind why this decreases the efficiency of the resulting device. Theories include that incorporation of more In may cause InN quenching precipitates to form in the light emitting region. The inventor has recognized the efficiencies of each type of light emitting device, and particularly, that devices combining the strengths of OLED technology with the strengths of inorganic LED technology may be achieved, where the strength of each technology addresses the weaknesses of the other.

Embodiments may have applicability to a wide range of uses, including as part-of, or in combination with, backlighting devices and other display technology. At present, LCD backlights are evolving from cold cathode fluorescent tubes distributed across the display area to a plate comprising a combination of a diffuser, a waveguide and a set of LEDs. The diffuser is often formed on one side of a waveguide plate with the LEDs arranged so as to couple light into the plate from its edge. The diffuser is designed to couple a small amount of the guided light out of the plate as it traverses the plate area, which causes light to be emitted uniformly from one or both surfaces of the plate. The cost of such backlights has decreased to the point where they are now employed in various consumer devices such as laptop computer displays and large area video screens. In the latter application, the backlights have the additional advantage of permitting rapid local dimming of the backlight for deeper black levels and an enhanced contrast ratio. The cost of these systems using, for example, an acrylic plate and an inexpensive, embossed diffuser, may reach the point where they are suitable for large area solid state lighting applications.

Nevertheless, a potential problem still exists in the Group III—Nitride systems that are used to generate the light that is coupled into such diffused light sources. This may be referred to as the "green gap" in quantum efficiency. Gallium nitride doped with indium has demonstrated extremely high efficiency of light emission in the blue spectral region, but in order to shift the color of emission into the green spectral region, progressively more indium must typically be incorporated into the semiconductor crystal. As noted above, this has been shown to lead to indium nitride precipitates which quench light emission and reduce the quantum efficiency of the LED. Conversely, it is currently not feasible to widen the bandgap of red emitting AlGaInP materials sufficiently to shift their light emission into the green spectral region. The overall result is that LED technology, which is strong in the blue and red spectral regions, is relatively weak in the area of green light emitters. However, a high color rendering index coupled with a desirable correlated color temperature (CCT) requires relatively little blue light and a larger amount of green and red light. This may be one reason why inorganic LED technology has had much success with high efficiency "cool" (i.e. bluish) illumination sources than with "warm" (i.e. yellow) light sources. The latter class of colors are in demand for general lighting applications.

Organic light emitting devices (OLED), however, have achieved extremely high quantum efficiencies, approaching 100%, in the green and red spectral regions. Blue emission, however, often continues to lag behind in performance, particularly if a long operating lifetime is required. If a high efficiency, long lived blue light source using organic light emitting devices were to become available, the appeal of organic solid state lighting would increase significantly.

The inventor has recognized that an increase in white light efficiency would be generated by combining a blue LED with green, red, and/or yellow OLEDs (or alternatively blue and red LEDs with a green and/or yellow OLED). Furthermore, the inventor has recognized that the large area nature of organic light sources can be effectively combined with the point source nature of inorganic LEDs. One possible manner in which to accomplish this is by using edge-coupled LED emitters to simulate a large area lamp, combined with intrinsically large area OLEDs and/or transparent OLEDs. Other ways to effectuate this outcome may also be used, some of which are described in detail with regards to the exemplary embodiments discussed below.

In some embodiments, the combination of a blue inorganic LED with an OLED is utilized to create a large area lamp. It is preferred that the light source is not image-forming and is therefore distinct from the field of displays.

Figure 4:
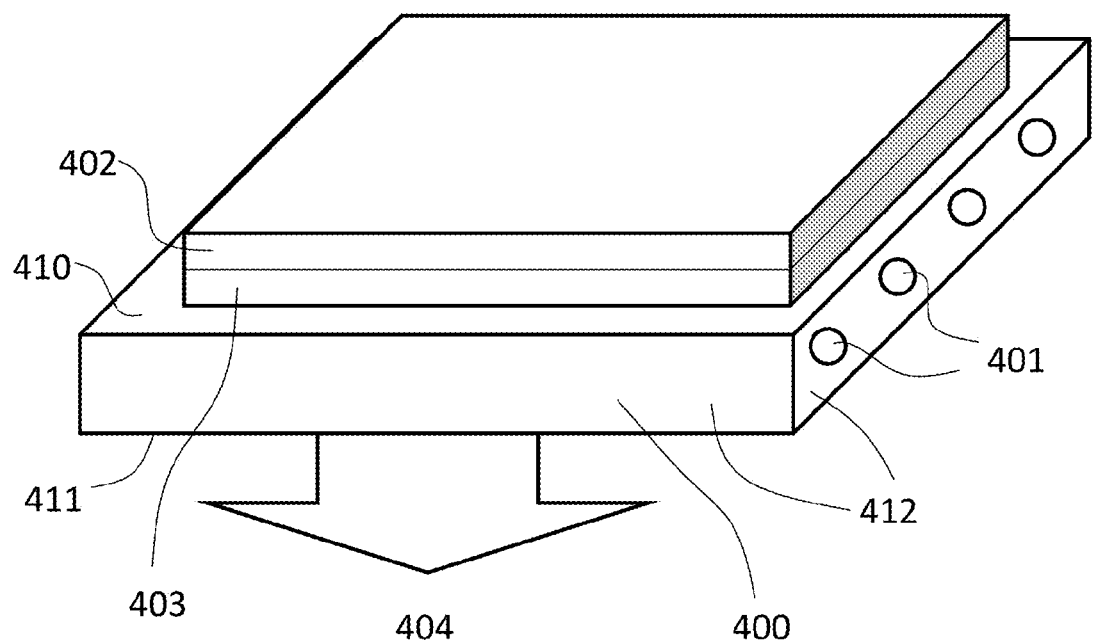
FIG. 4 shows an exemplary embodiment of a first device that includes a waveguide.
Figure 5:
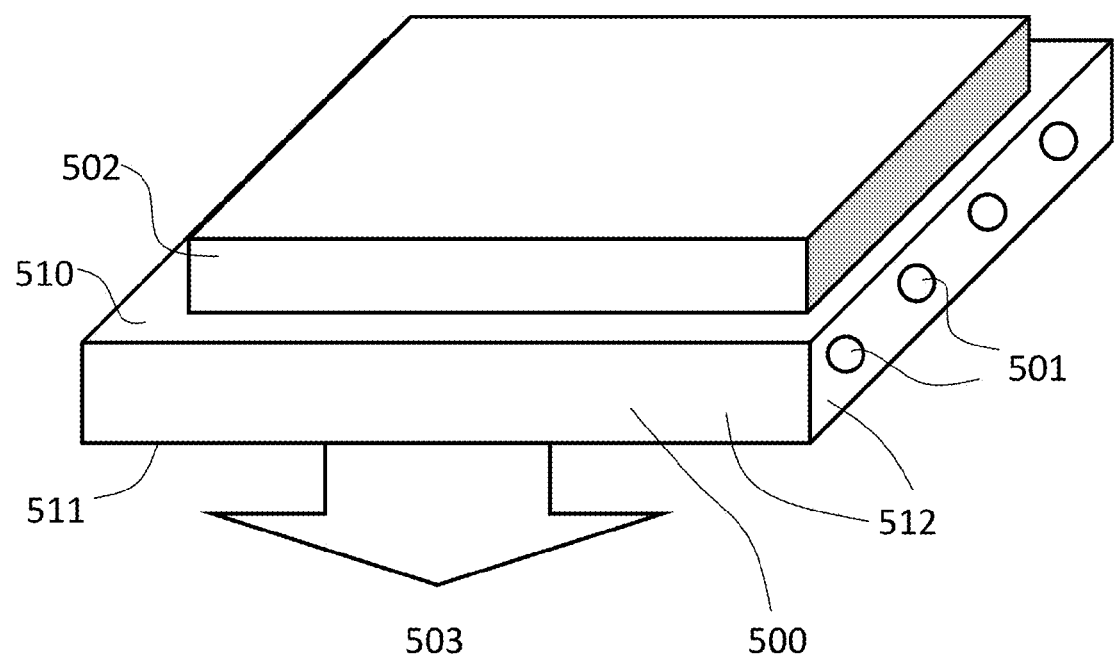
FIG. 5 shows an exemplary embodiment of a first device that includes a waveguide.

In some embodiments, a transparent plate with one or more blue LEDs disposed so as to couple blue light into the plate is provided. This may comprise a portion of a waveguide. The surface of the plate may be treated so as to couple a substantially constant amount of blue light out of the waveguide surface per unit area. Continuing with this exemplary embodiment, one or more OLEDs may be disposed on at least one surface of the plate so as to add longer wavelengths of light to make an acceptable white light source. This is sometimes referred to as an "area white" emitter because there may be no apparent structure to the white light emission. FIG. 4 shows an exemplary embodiment of an OLED that may comprise a combination using 2-SOLEDs 402 and 403 consisting of red and green elements. FIG. 5 shows an exemplary embodiment where only a single yellow OLED 502 may be utilized to give a white output. In some embodiments, red and blue LEDs and green OLEDs may be used, which may provide some additional advantages based in-part on the fact that the so-called "green gap" may be the weakest area of conventional LED technology. Typically, the use of blue OLEDs should also be avoided.

In regards to the composition of a waveguide structure, it is contemplated that any technology in existence for achieving a uniform light emitting surface by coupling LEDs into an edge of a transparent plate may be utilized. In some embodiments, known techniques are used to couple the LEDs into an edge surface with the addition of one or more OLEDs on an area surface of the plate. Embodiments may also include integrating LEDs into similar devices, particularly at the die level to save cost. Any material that adequately functions as a waveguide in accordance with the disclose discussed herein is contemplated. As an example, the waveguide may preferably comprise a material such as acrylic. However, other transparent polymers or glass may also be used. Such components are well known in the art and are readily available commercially. Other white emitting products use either separate red, blue and green LEDs or a blue LED with a yellow phosphor down converter in the package.

Figure 8:
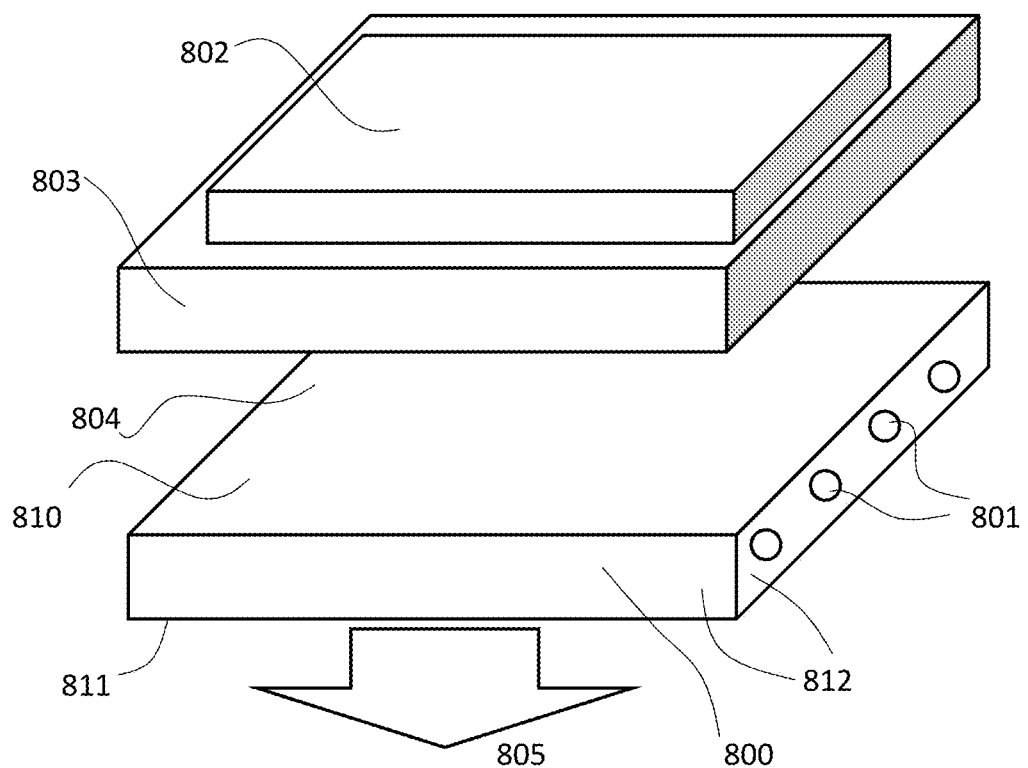
FIG. 8 shows an exemplary embodiment of a first device that includes a waveguide.

It is possible to grow OLEDs directly on a waveguide. However, it is also possible to dispose one or more OLEDs on the waveguide by a process other than directly growing or depositing the OLED on the waveguide. Several factors can be considered in making this determination, including the substrate quality, the ease or difficulty in fabrication, encapsulation, etc. Alternatively, lamination of one or more OLEDs onto the backlight (e.g. waveguide) may also be used. It may also be desirable to add optical engineering between a waveguide and an OLED. FIG. 8 shows such an exemplary embodiment. In some embodiments, the first device may include thin film modifiers, partial reflectors or texturing to control the outcoupling of the blue light and/or the blue light and the transmission of the OLED components. Optical filters may also be incorporated that reflect blue light but transmit other wavelengths, which may be utilized to, for example, stop losses by absorption of the blue LED in the OLED layers. Cost and ease of manufacture may be a consideration for such embodiments. It may also be preferred to allow light emitted by the OLEDs to pass through the waveguide and the light emitting surfaces without any coupling.

The first device may utilize OLEDs, TOLEDs, SOLEDs, and/or some combination thereof, depending on the desired emission pattern of the white light. It may also be possible to make the entire device curved, or even flexible or conformable, the latter options also allowing for the shaping of the output light.

Figure 6:
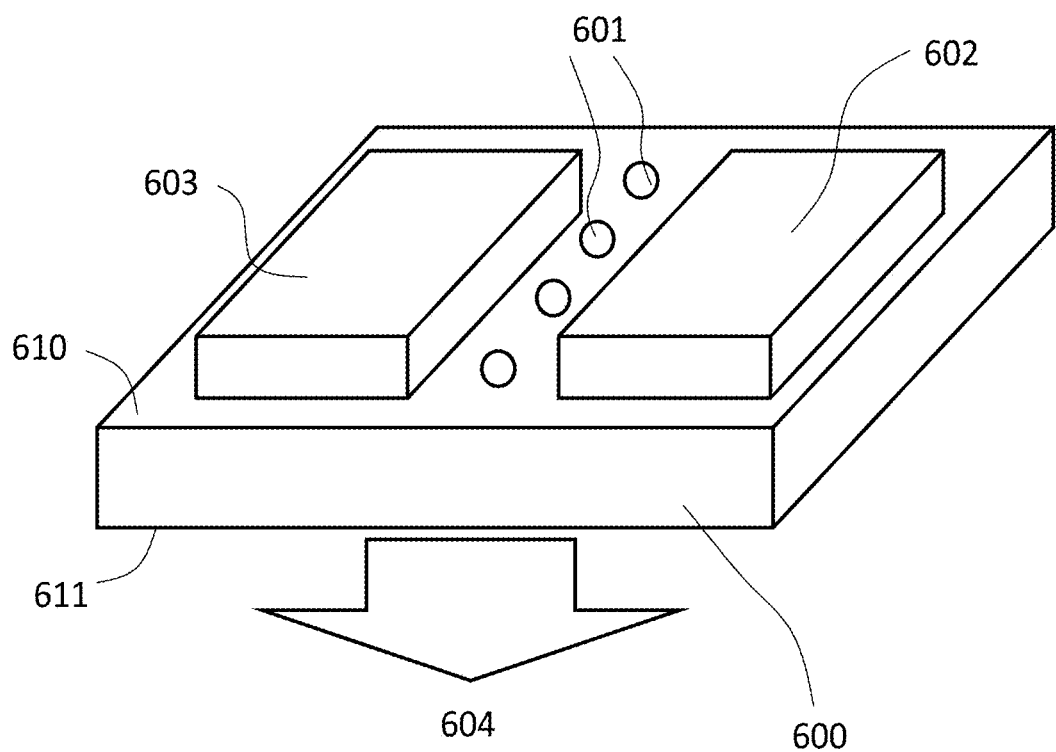
FIG. 6 shows an exemplary embodiment of a first device.
Figure 7:
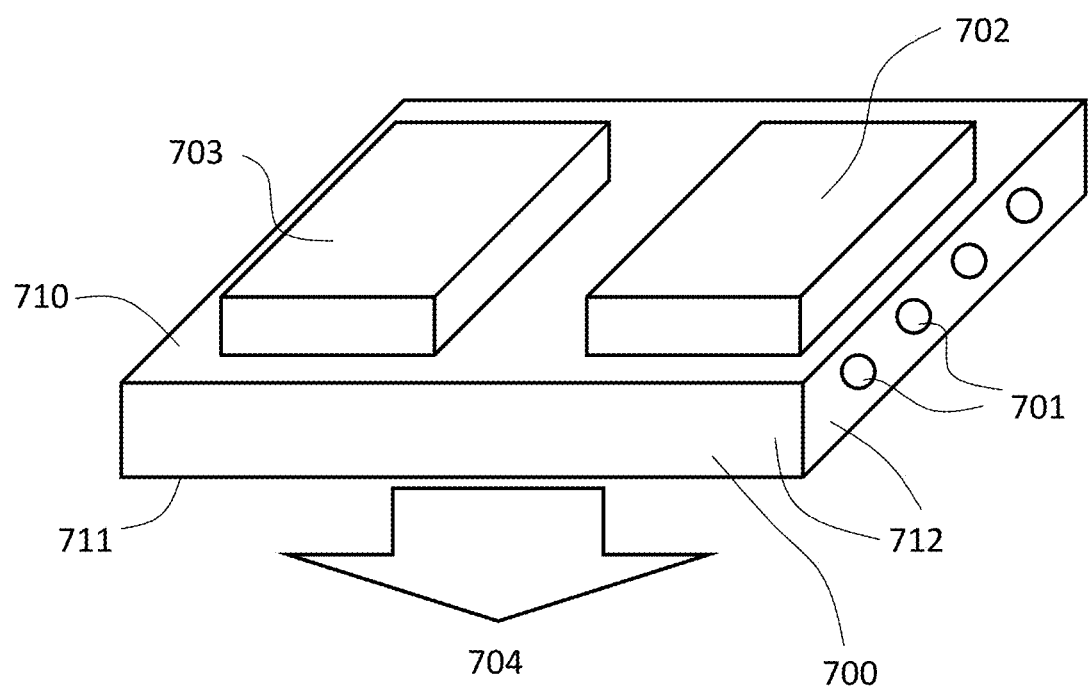
FIG. 7 shows an exemplary embodiment of a first device that includes a waveguide.

In some embodiments, separate colored regions of light emission may be visible when examined at sufficiently close range. At greater distances from the device, the light emissions would mix to form acceptable white light at an illuminated surface. This may be referred to as "segmented white" emitters. FIG. 6 and FIG. 7 show examples of such embodiments. According to these exemplary embodiments, the OLED components 602/702 and 603/703 could be laterally patterned red and green pixels disposed on a substrate or a waveguide. In some embodiments, the entire coupled blue LED source 601/701 could be discarded in favor of discrete blue LED packages (or possibly dies) dispersed across the substrate in such a way as to add sufficient blue into the far field spectrum to achieve white light with an acceptable quality. This may alleviate the need for a waveguide to dilute the high intensity point source generated by a light source comprising LEDs.

FIG. 10 shows an exemplary embodiment that is directed to red and green OLEDs on discreet substrates and separate blue LEDs dispersed in space. In some embodiments, a reflector 1004 and/or and lens and/or a diffuser 1005 may be included to mix and direct the light in a particular direction.

In other exemplary embodiments, examples of which are shown in FIG. 10-12, the OLEDs and LEDs could be on entirely different substrates, the only requirement being that their light outputs are sufficiently coupled to give acceptable quality white light at an illuminated surface or object, or other location. FIG. 12(b) shows an exemplary embodiment that comprises a red/green 2-SOLED stack as a lampshade 1210 with one or more blue LEDs 1201 in the center, where a conventional light bulb would otherwise be. An alternative embodiment may include a blue LED that could shine through a hole in the cathode of a large area 2-SOLED or Red and Green stripe OLED, which could further be arranged in some three dimensional configuration.

In some embodiments, the first device may include the use of a heat element or filter in front of the LEDs or LED array to protect the OLED components from heating. In part because LEDs are a compact point source of light, the junction temperature of inorganic InGaN LEDs can exceed 150° C. Removing this heat may present a significant challenge because, for instance, the compact and relatively small nature of these OLED and LED devices, along with the relatively low specific heat characteristics, potentially high heat generation from the LED, and susceptibility of the OLED to damage from heat at levels generated by an LED, can cause issues with device performance and lifetime due to overheating. Effective heat removal from the device may improve the OLED lifetime and prevent differential aging by lowering the overall temperature experienced by the OLED device. In some embodiments, the first device may include a dielectric reflector in front of the LEDs. Alternatively, cooling fins on the LED may also be utilized to reduce heat. Additionally, forms of active heat removal around the LEDs such as thermoelectric coolers or forced fluid cooling may also be used.

In some embodiments, the first device that includes both LEDs and OLEDs may also include an electric driving component to determine the amount of current to supply to a component or components of the device. The driving component may be used, for instance, to handle proportional dimming of the LED and OLED, as well as to provide the potential for color-tuning. In general, control of the separate color elements in any color-mixing white light geometry is important, particularly to maintain control over the color of white light that is emitted as the device (e.g. a lamp) is dimmed or as aging of the components of the device occurs. Depending on the application, it may be desirable to maintain the CCT as the first device is dimmed. In some embodiments, it may be desirable to lower the CCT as the first device is dimmed, so as to, for instance, mimic the characteristics of an incandescent lamp with which a consumer may be familiar.

Figure 13:
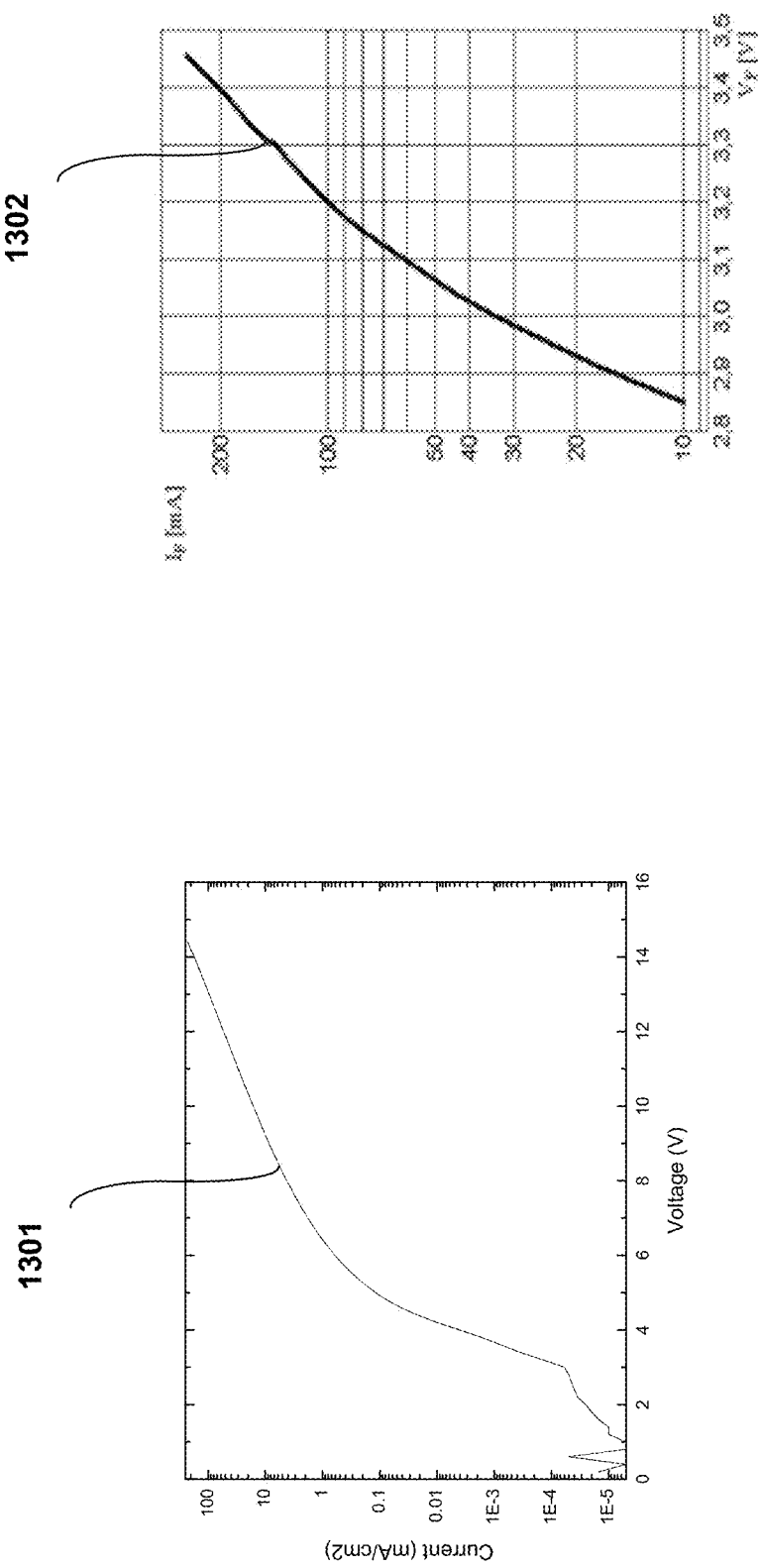
FIG. 13 shows a graph of relationship between current density and voltage for an LED and OLED.

Controlling the CCT of the first device presents a challenge, in part, because the current-voltage characteristics of OLEDs and LEDs are fundamentally different. This is illustrated in FIG. 13, which shows the dependence of current density on voltage for an OLED 1301 and LED 1302. The inventor generated the data 1301 by utilizing the known characteristics of the a red OLED described in detail below. To generate the data 1302 for the LED, the inventor used known characteristics for a Blue LED as described in Osram, OSLON SX, *Opto Semiconductors*: LD CN5M, LT CN5M (Jan. 12, 2009) (hereinafter "Osram"), which is also described in more detail below. Referring again to FIG. 13, the data indicates that to the first order, the OLED data 1301 behaves like a diode, in that it has exponential dependence that approximates to a straight line on a semi-log plot. In contrast, the LED 1302 behaves more like a resistor with traps, in that it has significant curvature to the semi-log I-V characteristic. To a first approximation, the light output is approximately linear in current in both cases (actually slightly sub-linear due to droop in the LED and multi-exciton effects in the OLED), so it may be assumed for simplicity that the luminosity-voltage curves will be substantially the same shape as the I-V curves shown in FIG. 13. As noted above, the OLED data shown in FIG. 13 represents experimental results obtained by the inventor, where as the LED data was obtained from Osram, which is hereby incorporated by reference. Therefore, for some embodiments, a desired luminance or CCT level may not be achievable by supplying the same (or similar, or linearly scaled) current to both the LED and OLED light emitting devices. This may be particularly the case when the luminance level is varied from one level to another (e.g. a dimmer function), as the relationship dependency between light emissions and drive current for the two types of devices may not be the same.

As mentioned above, in some embodiments it is likely that the OLEDs and LEDs will have different characteristics, and, in particular that the luminance and correlated color temperature dependence on drive current for the OLEDs and the LEDs will be different. That is, for the same drive current, an OLED and an LED will often have different luminance and correlated color temperature. Therefore, when these light emitting devices are combined into a single ("first") device, the electronic driving components may need to adjust the drive currents supplied to each of the light emitting devices to ensure that the desired CCT for the first device is maintained as the overall luminance of the first device is adjusted. This can be achieved by, for instance, storing the LED or OLED characteristics in a lookup table and having the drive component or components access this information and apply current accordingly. That is; based on the characteristics of the light emitting device or devices that the drive component is configured to control (e.g. an LED or OLED), the amount of current required to be supplied to achieve a desired output luminance and/or CCT may be determined by utilizing the stored information about the characteristic of each light emitting device or devices.

In some embodiments, sensors could be incorporated into the first device to measure the light out put (e.g. determine the CCT and luminance) so that real time adjustment could be made to the supplied drive current of each light emitting device so as to provide the desired characteristics. This may be done, for instance, based on algorithms that adjust drive currents provided by a driving component or components until the sensors measure the correct light output. In this manner, in some embodiments, the use of sensors and accompanying circuitry for controlling the drive current supplied could thereby adjust for changes in the OLED or LED characteristics over time (that is, as the device characteristics change through use such as again).

It should be understood that although the driving component and components were described above as each providing a single current, in some embodiments a driving component could provide different drive currents to different components of the first device. That is, in some embodiments, a single drive component could comprise circuitry and/or other components so as to provide multiple desired drive currents to different components of the first device.

In some embodiments, the drive current that is supplied to at least one of the LEDs and at least one of the OLEDs by the driving component or components in a device may be independently controlled and may not be linearly related. For example, and for illustrations purposes only, in an exemplary device if the current supplied to an LED increases by one mA, the current supplied to the OLED may also increase by one mA. If the current supplied to the LED is then increased by and additional one mA, the current supplied to the OLED may then increase by 3 mA (this may of course, vary based on the various properties of the device, as well as the desired characteristics of the combined emissions, etc.). The non-linear relationship may be required because, as described above, the current and voltage relationship between the LED and OLED devices may not be the same, such that to maintain luminance properties like the CCT value of the combined emissions, it may be necessary to vary the current supplied to each in a non-linear manner.

Also contemplated herein is a method for manufacturing a large area OLED device, including disposing OLED devices on a waveguide with edge-coupled LEDs so as to combine the light emissions from each source. Furthermore, methods and apparatus for driving the combination of OLED light emitting devices and LED light emitting devices are included herein.

Embodiments may have the advantage of combining the naturally large area, dilute nature of OLEDs with the small area, intense nature of LEDs. For instance, by utilizing a waveguide adapted to accept light from an intense light source and combine it with light emissions from a dilute light source.

However, these examples, and the exemplary embodiments discussed in more detail below, are not meant to be limiting, as other embodiments may have applicability to a broad range of technologies and products. One reason embodiments may have such a wide range of applicability is that the quality of organic OLED and inorganic LED light is fundamentally different. The former is a large area, diffuse source of illumination whereas the latter is a bright point source. Although either can be satisfactorily used for general illumination, each has different esthetic strengths in illuminating, for example, skin tones or gemstones. The combination of bright point sources with large area dilute sources may therefore generate a pleasing quality of light across a range of subjects. In these instances, both the OLED and the LED may be "white" or the OLED may be a warm white and the LED a cool white.

Embodiments will now be described in greater detail, with reference to the Figures provided where appropriate.

A first device is provided, wherein the first device is an illumination source comprising OLEDs and LEDs. The first device includes a first light source that has one or more first light emitting devices. Each of the first light emitting devices includes an inorganic light emitting diode (LED) that emits light that has a peak wavelength in the visible spectrum between 400 and 500 nm. The first light source may have additional light emitting devices, so long as it comprises at least one inorganic LED that emits light with a peak wavelength within this range.

The first device also includes a second light source that has one or more second light emitting devices. Each of the second light emitting devices comprises an organic light emitting diode (OLED) that emits light that has peak wavelength in the visible spectrum between 500 and 800 nm. As described above, an OLED may include a bottom or top emission organic light emitting diode, a stacked organic light emitting diode (SOLED), a transparent organic light emitting diode (TOLED), an inverted organic light emitting diode, and/or any other variation/combination of OLED devices. The first light source and the second light source are disposed such that their emissions combine. Preferably the combined light emissions comprise white light. Generally, the combination of the light emissions from the first and second light sources occurs in a zone of illumination, which does not have to occur within the first device, but may occur at some distance from the device, including at the point where, or after, the light reflects off of a surface. For example, in some embodiments including the laterally patterned embodiments such as those described with reference to FIGS. 6 and 7, the light may not be mixed when it leaves the device (i.e. a close examination will reveal the colors in a similar manner to examining a TV screen very closely), but the colors will mix into white light before reaching the object to be illuminated whether it is a desk, a floor area or an art object etc.

A first device as described above provides the advantages of inorganic LED devices, that are typically strong in blue light, with the advantages of OLED devices, which are typically strong for light having higher wavelengths. For instance, a device having red, blue and green LED light sources would usually have its lifetime and efficiency limited by the green LED. In contrast, a device having blue, red, and green OLED light sources would typically be limited by the efficiency and lifetime of the blue OLED. Thus, utilizing blue LEDs with yellow and/or green OLEDs and/or red LEDs or OLEDs, may result in an overall device that has a longer life time and higher operating efficiencies than can be obtained using either organic or inorganic technology alone. Furthermore, as noted above, the combination of bright point sources with large area dilute sources may generate a pleasing quality of light across a range of subjects.

The color of the light emitted from a lighting device may be measured using CIE coordinates, which are well known to the art. Unless otherwise specified, CIE coordinates as used herein refer to 1931 CIE coordinates. Preferably, the first light source and the second light source may be coupled so that the combined emissions have a color rendering index (CRI) of at least 70. Preferably, the first light source and the second light source of the first device are coupled so that the combined emissions have a color rendering index (CRI) of at least 80. For embodiments that include a third light source that is coupled to the first and second light sources, the light sources may be coupled such that their combined emissions have a color rendering index (CRI) of at least 70, and more preferably a CRI of at least 80.

Preferably, the first light source and the second light source are coupled so that the combined emissions are within a four step MacAdam ellipse of the CIE chromaticity coordinates [0.33, 0.33]. For embodiments where a third light source that is coupled to the first and second light sources, the light sources may be coupled such that their combined emissions are within a four step MacAdam ellipse of the CIE chromaticity coordinates [0.33, 0.33].

In some embodiments, the first device as described above may comprise an area illumination device. In contrast to a linear illumination device, an area illumination device emits light in two dimensions. Such devices may be used, by way of example and not limitation, to provide interior lighting, decorative lighting, backlighting for display devices, and many other applications. The area of such an illumination device may be determined by the measure of the dimensions of the surface area that is substantially perpendicular to the propagation direction of the light that is emitted. Typically, the larger the area in such light emitting devices, the larger the area that may be illuminated by the emission of light by the device at a given brightness and a given distance from the device. However, devices with smaller area may have applicability in different applications that require a smaller device with less surface area, particularly for inclusion in small displays. Generally, the larger the area of an illumination device (in terms of physical dimensions) the more light that can be emitted from the device without driving the OLED(s) at a high current, which would likely have the effect of increasing the rate of degradation of the OLED.

Preferably, the smallest of the dimensions that define the area of the first device may be at least 1 cm. More preferably, the smallest of the dimensions that define the area of the first device is at least 6 cm. As used herein, the smallest dimension that defines the area of the first device was explained above with reference to FIG. 3. Devices with dimensions smaller than these may be less desirable for illuminating large areas.

In some embodiments, the first device may include a first and a second light source. The first light source may include one or more inorganic LEDs that emit light having a peak wavelength in the visible spectrum between 400 and 500 nm. The second light source may include one or more OLEDs that emit light that has a peak wavelength in the visible spectrum between 500 and 580 nm. This peak wave length typically corresponds to light emissions in the green spectrum. Preferably, the device does not include any LEDs that emit light that has peak wavelength in the visible spectrum between 500 and 800 nm. As discussed in detail above, OLED devices that emit light having a peak wavelength between 500 and 800 nm are typically more efficient than inorganic LED devices for the same peak wavelength. Therefore, it may be beneficial to utilize the OLED devices for emitting light with a peak wavelength in this range rather than utilizing LED devices so as to provide increased performance and efficiency. The combination would combine some of the strong aspects of inorganic LED technology, with some of the strong aspects of OLED technology while at the same time addressing some of the weaknesses of each.

In some embodiments, the first device may include first, second and third light sources. The first light source may include one or more LEDs that emit light having a peak wavelength in the visible spectrum between 400 and 500 nm. The second light source may include one or more OLEDs that emit light that has a peak wavelength in the visible spectrum between 500 and 580 nm. The third light source may include one or more OLEDs that emit light that has a peak wavelength in the visible spectrum between 580 and 700 nm. By utilizing a third light source, it may be possible to obtain a higher CRI, or at the very least, higher CRIs and high efficiency may be more readily achievable. Devices according to this embodiment also utilize the strengths of LED technology in the blues, with the strengths of the OLED technology in the higher wavelengths, as noted above.

Preferably, the device does not include any LEDs that emit light that has peak wavelength in the visible spectrum between 500 and 800 nm. The third light source may be coupled with the first and second light sources so that their light emissions combine such that the combined light emission is within a four step MacAdam ellipse of the CIE chromaticity coordinates [0.33, 0.33] and/or so that the combined emission has a CRI index of at least 80.

In some embodiments, the first device may include a first and a second light source. The first light source may include one or more LEDs that emit light having a peak wavelength in the visible spectrum between 400 and 500 nm. The second light source may include one or more OLEDs that emit light that has a peak wavelength in the visible spectrum between 550 and 600 nm. The embodiment may offer several advantages, including decrease fabrication costs because only type of OLED device is utilized. Congruently, it may decrease the difficulty and complexity of the manufacturing process. Thus, these devices may be well suited when cost is a determining or important factor. Preferably, the device does not include any LEDs that emit light that has peak wavelength in the visible spectrum between 500 and 800 nm.

In some embodiments, the first device may include a first, second, and fourth light source. The first light source may include one or more LEDs that emit light having a peak wavelength in the visible spectrum between 400 and 500 nm. The second light source may include one or more OLEDs that emit light that has a peak wavelength in the visible spectrum between 500 and 580 nm. The fourth light source may include one or more LEDs that emit light that has a peak wavelength in the visible spectrum between 580 and 700 nm. The term "fourth light source" is used in describing this embodiment for descriptive purposes only so as to distinguish this embodiment from embodiments wherein the third light source comprises one or more OLEDs that emit light that has a peak wavelength in the visible spectrum between 580 and 700 nm. This does not imply that there is a "third light source" in this embodiment. Thus, for example, the first device may comprise an LED having peak wavelength emissions between 400 and 500 nm (e.g. blue) and an LED having peak wavelength emissions between 580 and 700 nm (e.g. red), along with an OLED having peak wavelength emissions of 500 to 580 nm (e.g. green). The fourth light source may be coupled with the first and second light sources so that their light emissions combine, and that the combined light emission is within a four step MacAdam ellipse of the CIE chromaticity coordinates [0.33, 0.33] and/or has a CRI index of at least 70.

In some embodiments, the first device as described above is a lamp, a fixture, and/or a luminaire. A light "fixture" or light fitting is an electrical device used to create artificial light and/or illumination. A "luminaire" is a lighting fixture that may be complete with a light source or lamp, a reflector for directing the light, an aperture (with or without a lens), the outer shell or housing for lamp alignment and protection, an electrical ballast and/or power supply, and connection to a power source, and usually a light socket to hold the lamp and allow for its replacement. A "lamp" is typically defined as related to the light emitting component itself. For example, a light bulb may be a lamp. In various embodiments, the first device is optionally deformable. This often permits the shape of the first device to be altered without altering the performance. For instance, the OLED light emitting devices that may comprise the first device may include flexible substrates. Devices that are deformable provide greater flexibility and durability as the device may be included in additional applications with a reduced fear of damage to the device.

In some embodiments, the first device includes a first light source, a second light source, and an optical waveguide structure. The first light source may include one or more LEDs that emit light having a peak wavelength in the visible spectrum between 400 and 500 nm. The second light source may include one or more OLEDs the emit light that has a peak wavelength in the visible spectrum between 500 and 800 nm. The optical wave guide structure includes a first surface and a second surface. The first surface is opposed to the second surface. The optical waveguide structure may also include one or more edge surfaces. At least one of the surfaces of the optical waveguide is a light emitting surface.

The first light source may be coupled to the optical waveguide so that the first light source emits light into the optical waveguide structure. Preferably, the optical waveguide structure is configured to emit a substantially uniform amount of blue light per unit of surface area of the emitting surfaces. This may be achieved by utilizing a material such as an acrylic plate and an embossed diffuser. However, any suitable material may be utilized for the waveguide structure. Preferably, the light emitting surface may be further textured so as to improve the outcoupling of light from the second light source. The texturing on the waveguide surface that may be necessary to have substantially uniform outcoupling of the blue LED light may also act as an outcoupling enhancement for the OLEDs. The waveguide structure may have any shape, including but not limited to, rectangular, triangular or cylindrical. An optical waveguide may be utilized in connection with multiple OLED light sources and/or LED light sources, as illustrated below.

Furthermore, the use of a waveguide may provide the advantage of allowing for the emissions of LEDs, which are usually high intensity point lights sources, to be diluted and combined with light emissions from an OLED, which is usually a low intensity light source, for general illumination purposes.

In some embodiments, a first device may include an optical waveguide structure, a first light source, and a second light source. The first light source may include one or more LEDs that emit light having a peak wavelength in the visible spectrum between 400 and 500 nm. The second light source may include one or more OLEDs. The OLEDs that comprise the second light source may emit light that has a peak wavelength in the visible spectrum between 500 and 580 nm.

The optical wave guide structure may include a first surface and a second surface. The first surface is opposed to the second surface. The optical waveguide structure may also include one or more edge surfaces. At least one of the surfaces of the optical waveguide is a light emitting surface. Preferably, the optical waveguide structure is configured to emit a substantially uniform amount of blue light per unit of surface area of the emitting surfaces. Preferably, the light emitting surface may be further textured so as to improve the outcoupling of light from the second light source. The first light source may be coupled to the optical waveguide so that the first light source emits light into the optical waveguide structure.

The first light source and the second light source may be disposed such that their emissions combine. Preferably the combined light emissions comprise white light. As described above, the combination of the light emissions from the first and second light sources to comprise white light does not have to occur within the first device, but may occur at some distance from the device, including at the point where, or after, the light reflects off a surface. Preferably, the first device does not include any inorganic LEDs that emit light that has peak wavelength in the visible spectrum between 500 and 800 nm.

In some embodiments, the first device may include a first light source, a second light source, a third light source, and an optical waveguide structure. The first light source may include one or more LEDs that emit light having a peak wavelength in the visible spectrum between 400 and 500 nm. The second light source may include one or more OLEDs that emit light that has a peak wavelength in the visible spectrum between 500 and 580 nm. The third light source may include one or more OLEDs that emit light that has a peak wavelength in the visible spectrum between 580 and 700 nm.

The optical waveguide structure may include a first surface and a second surface. The first surface is opposed to the second surface. The optical waveguide structure may also include one or more edge surfaces. At least one of the surfaces of the optical waveguide is a light emitting surface. Preferably, the optical waveguide structure is configured to emit a substantially uniform amount of blue light per unit of surface area of the emitting surfaces. Preferably, the light emitting surface may be further textured so as to improve the outcoupling of light from the second light source. The first light source may be coupled to the optical waveguide so that the first light source emits light into the optical waveguide structure.

The first light source, the second light source, and the third light source may be disposed such that their emissions combine. Preferably the combined light emissions comprise white light. As described above in reference to other embodiments, the combination of the light emissions from the light sources that comprise white light does not have to occur within the first device, but may occur at some distance from the device, including at the point where the light reflects off a surface or thereafter. Preferably, the first device does not include any inorganic LEDs that emit light that has peak wavelength in the visible spectrum between 500 and 800 nm. Examples of this embodiment are provided at least with reference to FIGS. 4 and 7-9, and/or the description provided herein.

This embodiment offers several advantages. For instance, the use of three light sources, which may include the primary colors red, blue, and green, typically allows for a higher CRI at high efficiency than utilizing only two light sources. Moreover, this configuration allows for the use of blue LEDs, which typically have a longer operating life time and better operating efficiency than blue OLEDs, with red and green OLEDs. Furthermore, the use of a waveguide is preferred because it may allow for the emissions of LEDs, which are usually high intensity point lights sources, to be diluted and combined with light emissions from an OLED, which is usually a low intensity light source, for general illumination purposes.

In some embodiments, a first device may include an optical waveguide structure, a first light source, and a second light source. The first light source may include one or more LEDs that emit light having a peak wavelength in the visible spectrum between 400 and 500 nm. The second light source may include one or more OLEDs. The OLEDs that comprise the second light source may emit light that has a peak wavelength in the visible spectrum between 550 and 600 nm. The optical wave guide structure may include a first surface and a second surface. The first surface is opposed to the second surface. The optical waveguide structure may also include one or more edge surfaces. At least one of the surfaces of the optical waveguide is a light emitting surface. Preferably, the light emitting surface may be further textured so as to improve the outcoupling of light from the second light source. Preferably, the optical waveguide structure is configured to emit a substantially uniform amount of blue light from the LED(s) per unit of surface area of the emitting surfaces.

The first light source may be coupled to the optical waveguide so that the first light source emits light into the optical waveguide structure. The first light source and the second light source may be disposed such that their emissions combine. Preferably the combined light emissions comprise white light. As described above, the combination of the light emissions from the first and second light sources that comprises white light does not have to occur within the first device, but may occur at some distance from the device, including at a point where, or after, the light reflects off a surface. Preferably, the first device does not include any inorganic LEDs that emit light that has peak wavelength in the visible spectrum between 500 and 800 nm. Examples of this embodiment are provided at least in reference to FIGS. 5 and 8-9, which are described in detail below.

This embodiment offers several advantages. For instance, the use of two light sources, may reduce fabrication costs in comparison to the use of three light sources. Moreover, this configuration allows for the use of blue LEDs, which have a longer operating life time and better operating efficiency than blue LEDs, with preferably yellow OLEDs, which typically have high operating efficiencies and long lifetimes. Furthermore, the use of a waveguide is preferred because it may allow for the emissions of LEDs, which are usually high intensity point lights sources, to be diluted and combined with light emissions from an OLED, which is usually a low intensity light source, for general illumination purposes.

In some embodiments, the first device may include a first light source, a second light source, a fourth light source, and an optical waveguide structure. The first light source may include one or more LEDs that emit light having a peak wavelength in the visible spectrum between 400 and 500 nm. The second light source may include one or more OLEDs that emit light that has a peak wavelength in the visible spectrum between 500 and 580 nm. The fourth light source may include one or more LEDs that emit light that has a peak wavelength in the visible spectrum between 580 and 700 nm. The term "fourth light source" is used in describing this embodiment for descriptive purposes only so as to distinguish this embodiment from embodiments wherein the third light source comprises OLEDs that emit light that has a peak wavelength in the visible spectrum between 580 and 700 nm.

The optical waveguide structure may include a first surface and a second surface. The first surface is opposed to the second surface. The optical waveguide structure may also include one or more edge surfaces. At least one of the surfaces of the optical waveguide is a light emitting surface. Preferably, the optical waveguide structure is configured to emit a substantially uniform amount of blue light per unit of surface area of the emitting surfaces. Preferably, the light emitting surface may be further textured so as to improve the outcoupling of light from the second light source. The first light source may be coupled to the optical waveguide so that the first light source emits light into the optical waveguide structure.

The first light source, the second light source, and the fourth light source may be disposed such that their emissions combine. Preferably the combined light emissions comprise white light. As described above in reference to other embodiments, the combination of the light emissions from the light sources that comprise white light does not have to occur within the first device, but may occur at some distance from the device, including at the point where the light reflects off a surface or thereafter. This embodiment offers the advantage of utilizing red LEDs, which do not have some of the problems that green LEDs typically have. Thus, the embodiment only utilizes one light source that comprises an OLED, which may reduce costs and decrease the complexity of manufacturing.

FIG. 4 shows an exemplary embodiment of an area white emitter. The exemplary embodiment includes an optical waveguide structure 400, a first light source 401, a second light source 402, and a third light source 403. The first light source 401 may include one or more LEDs that emit light having a peak wavelength in the visible spectrum between 400 and 500 nm. The second light source 402 may include one or more OLEDs that emit light that has a peak wavelength in the visible spectrum between 500 and 580 nm. The third light source 403 may include one or more transparent OLEDs (TOLEDs) that emit light that has a peak wavelength in the visible spectrum between 580 and 700 nm. In some embodiments, the second 402 and third 403 light sources could comprise a SOLED.

The optical wave guide structure 400 includes a first surface 410 and a second surface 411. The first surface 410 is opposed to the second surface 411. The optical waveguide structure 400 may also include one or more edge surfaces 412. The first light source 401 may be coupled to the optical waveguide 400 so that the first light source 401 emits light into the optical waveguide structure. At least one of the surfaces of the optical waveguide is a light emitting surface. In the exemplary embodiment of FIG. 4, the second surface 411 is an emitting surface. However, other embodiments may include any surface of the waveguide, and/or multiple surfaces as emitting surfaces. Preferably, the optical waveguide structure is configured to emit a substantially uniform amount of blue light per unit of surface area of the emitting surfaces 404.

In the exemplary embodiment shown in FIG. 4, the second 402 and the third 403 light sources are disposed over the first surface 410 of the optical waveguide structure, and the first light source 401 is coupled to at least one of the edge surfaces of the optical waveguide structure. Preferably, the second and the third light emitting devices may be disposed such that at least a portion of the emissions from the second 402 and third 403 light sources propagates through the waveguide 400 and the light emitting surface 411. More preferably, the light emitted from the second 402 and third 403 light emitting devices propagates directly through the waveguide 400. This may be enhanced by, for instance, using dielectric stack filters or gratings on the emitting surface.

As illustrated in FIG. 4, the second light source 402 may be disposed over the third light 403 source, and the third light source 403 may include one or more transparent OLEDs. The third light emitting devices of the third light source 403 may be deposited directly onto the first surface 410 of the optical wave guide structure 400 using any of the above referenced deposition techniques such as thermal evaporation, ink-jet, organic vapor phase deposition (OVPD), etc. Alternatively, the third light emitting devices of the third light source 403 may be grown or deposited on a substrate and then laminated onto the first surface 410 of the optical waveguide structure 400, or attached to the surface of the optical waveguide structure in any manner.

It should be noted that as contemplated herein, the OLEDs that comprise the second and third light sources may be disposed in any suitable configuration relative to one another. For instance, the red OLEDs may be disposed over the green OLEDs, or the green OLEDs may be disposed over the red OLEDs. As a general matter, any OLED that is disposed between a viewer and another OLED should be a transparent OLED so that the light emitted from the other OLED may propagate through the transparent OLED to the user relatively unimpeded. Moreover, the OLEDs may be deposited directly onto the first surface of the optical wave guide structure using any of the aforementioned deposition techniques such as thermal evaporation, ink-jet, organic vapor phase deposition (OVPD), etc. Alternatively, the OLEDs may be deposited or grown on a separate substrate and laminated onto the first surface, or attached to the surface of the optical waveguide structure in any manner.

In operation, light emitted from the first light source 401 is coupled into the waveguide 400. The waveguide is designed so as to emit a substantially uniform amount of the light emitted from the first light source per unit area of the emitting surface or surfaces. In FIG. 4. this is the second surface 411. Preferably, in part because the second 402 and third 403 light sources include OLEDs, the light emissions from these devices will not be substantially coupled into the waveguide 400 but will propagate through the waveguide perpendicular to the guided modes of the first light source 401. The combined emissions from the first, second, and third light sources may propagate in direction 404, and may combine either in the waveguide or thereafter, such as after reflecting off of a surface.

The configuration shown in FIG. 4 offers several advantages. For instance, the use of three light sources, which may include the primary colors red, blue, and green, typically allows for a higher CRI at high efficiency than utilizing only two light sources. Moreover, this configuration allows for the use of blue LEDs, which typically have a longer operating life time and better operating efficiency than blue LEDs, with red and green OLEDs, which typically have high operating efficiencies and long. lifetimes. Furthermore, the use of a waveguide is preferred because it allows for the emissions of LEDs, which are usually high intensity point lights sources, to be diluted and combined with light emissions from an OLED, which is usually a low intensity light source, for general illumination purposes.

FIG. 5 shows an exemplary embodiment of a first device. The first device includes a first light source 501 and second light source 502, and an optical waveguide structure 500. The first light source 501 may include one or more LEDs that emit light having a peak wavelength in the visible spectrum between 400 and 500 nm. The second light source 502 may include one or more OLEDs that emit light that has a peak wavelength in the visible spectrum between 550 and 600 nm. The optical waveguide structure 500 includes a first surface 510 and a second surface 511. The first surface 510 is opposed to the second surface 511. The optical waveguide structure 500 may also include one or more edge surfaces 512. The first light source 501 may be coupled to the optical waveguide 500 so that the first light source 501 emits light into the optical waveguide structure 500. At least one of the surfaces of the optical waveguide is a light emitting surface. In FIG. 5, the second surface 511 is an emitting surface. Preferably, the optical waveguide structure 500 is configured to emit a substantially uniform amount of blue light per unit of surface area of the emitting surfaces 511.

Preferably, the first light source 501 is coupled to at least one of the edge surfaces 512 of the optical waveguide structure 500. However, in other embodiments, the first light source may be coupled to any surface or multiple surfaces of the waveguide. The second light source 502 is shown in FIG. 5 as disposed over the first surface 510 of the waveguide structure. Preferably, the second light source 502 is disposed such that at least a portion of the emissions from the second light source propagates through the waveguide 500 and the light emitting surface 511. More preferably, the light emitted from the second light source 502 passes directly through the waveguide without any substantial coupling to it. Preferably, the second light emitting devices of the second light source 502 are deposited directly onto the first surface of the optical wave guide structure. Any of the aforementioned deposition techniques may be used. In some embodiment, the second light emitting devices of the second light source 502 may be grown or deposited on a substrate and laminated onto the first surface 511 of the optical waveguide structure, or may be disposed over the surface 511 in any suitable manner.

In operation, light emitted from the first light source 501 is coupled into the waveguide 500. The waveguide is designed so as to emit a substantially uniform amount of the light emitted from the first light source per unit area of the emitting surface or surfaces. In FIG. 5. this is the second surface 511. Preferably, in part because the second light source 502 includes one or more OLEDs, the light emissions from these devices will not be coupled into the waveguide 500 but will propagate substantially through the first 510 and second 511 surfaces of the waveguide without substantially coupling into the guided modes of the waveguide. The combined emissions from the first and second light sources may propagate in direction 503 and may combine either in the waveguide or thereafter, such as after reflecting off of an illuminated surface.

This configuration shown in FIG. 5 offers several advantages. For instance, the use of two light sources may reduce fabrication costs in comparison to the use of three light sources. Moreover, this configuration allows for the use of blue LEDs, which typically have a longer operating life time and better operating efficiency than blue LEDs, with preferably yellow OLEDs Furthermore, the use of a waveguide is preferred because it typically allows for the emissions of LEDs, which are usually high intensity point lights sources, to be diluted and combined with light emissions from an OLED, which is usually a low intensity light source, for general illumination purposes.

FIG. 6 shows an exemplary embodiment of a first device. In this embodiment, the geometry does not utilize an optical waveguide, but instead utilizes a substrate 600. In this embodiment, the LEDs 601 are on the surface 610 of the substrate 600. The OLEDs of the second 602 and third 603 light source are also disposed over the surface 610. In this embodiment, the LEDs are not transformed into a "low intensity" source, but will remain specular lights interspersed between the large area red and green OLEDs. The colors may combine at some distance away from the first device, but less than the distance of an object to be illuminated so as combine sufficiently to provide white light.

In particular, FIG. 6 shows a first device that includes a first light source 601, a second light source 602, a third light source 603, and a substrate 600. The first light source 601 may include one or more LEDs that emit light having a peak wavelength in the visible spectrum between 400 and 500 nm. The second light source 602 may include one or more OLEDs that emit light that has a peak wavelength in the visible spectrum between 500 and 580 nm. The third light source 603 may include one or more OLEDs that emit light that has a peak wavelength in the visible spectrum between 580 and 700 nm.

The substrate 600 includes a first surface 610 and a second surface 611. The first surface 610 is opposed to the second surface 611. The second 602 and third 603 light sources may be disposed directly on the substrate 600 (that is, they may be grown or deposited on the substrate in any suitable manner including those discussed above) or they may be grown or deposited on separate substrates and then laminated on substrate 600. In this exemplary embodiment, the first light source 601 is disposed on the same surface 610 as the second 602 and third 603 light sources.

As shown in FIG. 6, the first 601, the second 602 and the third 603 light sources may be disposed over the first surface 610 of the substrate 600 such that at least a portion of their light emissions propagates through the first 610 and second 611 surfaces of the substrate 600. In this embodiment, the substrate is made of a transparent material such as, for instance, glass or plastic. The second light emitting devices 602 and the third light emitting devices 603 may be disposed over the first surface 610 of the substrate 600 so that they are physically segmented from each other. In other words, the first and the second light sources are disposed such that neither the second 602 nor the third 603 light source is disposed in a position over the other.

In operation, light emitted from the first 601, the second 602, and the third 603 light sources propagate through the first 610 and second 611 surfaces of the substrate 600 in the direction indicated by arrow 604. Because there is no waveguide structure utilized to dilute the first light source 601, which comprises one or more high intensity point source LEDs, the first light source 601 is not "transformed" into a "low intensity" source. The LEDs may remain as specular lights interspersed between the large area OLEDs of the second 602 and third 603 light sources. Typically, the light emissions from these devices will not be coupled at the substrate 600, but may combined to comprise white light thereafter, such as after reflecting off of an illuminated surface or at some other location at a distance away from the substrate 600. This may produce the effect that when an observer looks directly at the first device (or is relatively close to the first device), he may see the different wavelength emissions.

Alternatively, the first 601, second 602, and third 603 light sources could emit light that substantially propagates in the direction away from the first surface 610 of substrate 600. That is, the substantial amount of light emitted from these sources does not propagate through the first 610 and second 611 surfaces of the substrate. In this embodiment, the substrate may be made of any material, including opaque materials. The first 610 and/or the second 611 surfaces of the substrate could also be a reflector. Alternatively, the first 601, second 602, and third 603 light sources could emit light that propagates in both the direction shown by arrow 604 and the direction substantially away from substrate 600. In this embodiment, the second 602 and third 603 light sources may be TOLEDs.

The configuration shown in FIG. 6 offers several advantages. For instance, the use of three light sources, which may include the primary colors red, blue, and green, typically allows for a higher CRI at high efficiency than utilizing only two light sources. Moreover, this configuration allows for the use of blue LEDs, which have a longer operating life time and better operating efficiency than blue OLEDs, with red and green OLEDs, which typically have high operating efficiencies and long lifetimes. Because a waveguide is not used, this configuration may use other means of coupling the light emissions from the OLEDs of the second and third light sources with the LEDs of the first light source, such as by utilizing a sufficient propagation distance from the first device to the illuminated surface, a diffuser, or some other optical element that suitably mixes the different emissions.

FIG. 7 shows an exemplary embodiment of a first device. The first device includes a first light source 701, a second light source 702, a third light source 703, and an optical wave guide structure 700. The first light source 701 may include one or more LEDs that emit light having a peak wavelength in the visible spectrum between 400 and 500 nm. The second light source 702 may include one or more OLEDs that emit light that has a peak wavelength in the visible spectrum between 500 and 580 nm. The third light source 703 may include one or more OLEDs that emit light that has a peak wavelength in the visible spectrum between 580 and 700 nm.

The optical wave guide structure 700 includes a first surface 710 and a second surface 711. The first surface 710 is opposed to the second surface 711. The optical waveguide structure 700 may also include one or more edge surfaces 712. The first light source 701 may be coupled to the optical waveguide 700 so that the first light source 701 emits light into the optical waveguide structure 700. At least one of the surfaces of the optical waveguide is a light emitting surface. In FIG. 7 the second surface 711 of the waveguide is shown as light emitting. Preferably, the optical waveguide structure 700 is configured to emit a substantially uniform amount of blue light per unit of surface area of the emitting surface 711.

As shown in this exemplary embodiment, the second 702 and the third 703 light sources may be disposed over the first surface 710 of the optical waveguide structure 700 such that at least a portion of the emissions from the second 702 and the third 703 light sources propagates through the waveguide 700 and is directly emitted from the light emitting surface 711. The second light emitting devices 702 and the third light emitting devices 703 may be disposed over the top surface 710 of the optical waveguide structure 700 so that they are physically segmented from each other. In other words, the first and the second light sources are disposed such that neither the second nor the third light source is disposed in a position over the other.

Continuing with the description of the exemplary embodiment shown in FIG. 7, the second light emitting devices and the third light emitting devices may each be directly disposed on the first surface 710 of the optical wave guide structure. As shown, the first light source 701 may be disposed on one or more of the edge surfaces of the optical waveguide 700.

In operation, light emitted from the first light source 701 is coupled into the optical waveguide structure 700. The waveguide structure is designed so as to emit a substantially uniform amount of the light emitted from the first light source per unit area of the emitting surface or surfaces. In FIG. 7, this is the second surface 711. Preferably, in part because the second 702 and third 703 light sources include OLEDs, the light emissions from these devices will not be coupled into the waveguide 700 but will propagate directly through the waveguide and the light emitting surface 711. The combined emissions from the first, second, and third light sources may propagate in direction 704, and may combine either in the waveguide or thereafter, such as after reflecting off of an illuminated surface. Preferably, the combination of the light emissions occurs after the light emissions have propagated through the waveguide, which may produce the result that when an observer looks directly at the first device, he may see the different wavelength emissions.

FIG. 7 offers several advantages. For instance, the use of three light sources, which may include the primary colors red, blue, and green, typically allows for a higher CRI than utilizing only two light sources. Moreover, this configuration allows for the use of blue LEDs, which have a longer operating life time and better operating efficiency than blue OLEDs, with red and green OLEDs, which typically have high operating efficiencies and long lifetimes. Furthermore, the use of a waveguide is preferred because it allows for the emissions of LEDs, which are usually high intensity point lights sources, to be diluted and combined with light emissions from an OLED, which is usually a low intensity light source, for general illumination purposes. FIG. 7 offers the additional advantage of disposing of the first light source 701 on an edge surface of the waveguide, which may reduce fabrication costs because the OLED devices and the LED devices are not located on the same surface. Moreover, this may reduce the likelihood of damage that may be caused to the OLEDs when disposing of the LED devices on the same surface.

FIG. 8 shows an exemplary embodiment of a first device, which includes a first light source 801, a second light source 802, an optical waveguide structure 800 and an intervening substrate 803. The first light source 801 may include one or more LEDs that emit light having a peak wavelength in the visible spectrum between 400 and 500 nm. The second light source 802 may include one or more OLEDs. The OLEDs that comprise the second light source may emit light that has a peak wavelength in the visible spectrum between 500 and 800 nm. The optical wave guide structure 800 includes a first surface 810 and a second surface 811. The first surface 810 is opposed to the second surface 811. The optical waveguide structure 800 may also include one or more edge surfaces 812. At least one of the surfaces of the optical waveguide 800 is a light emitting surface. As shown in FIG. 8, the light emitting surface is the second surface 811. Preferably, the optical waveguide structure 800 is configured to emit a substantially uniform amount of blue light per unit of surface area of the emitting surface 811. The intervening substrate 803 may be disposed between the first surface 810 of the optical waveguide structure 800 and the second light source 802.

The first light source 801 may be coupled to the optical waveguide so that the first light source emits light into the optical waveguide structure. The second light emitting devices of the second light source 802 may be disposed on the intervening substrate 803. The second light source 802 may be disposed over all of, or just a portion of, the second substrate 803. In some embodiments, the second light source 802 may include one or more OLEDs that emit light that has a peak wavelength in the visible spectrum between 550 and 600 nm. Alternatively, the second light source 802 may include one or more OLEDs that emit light that has a peak wavelength in the visible spectrum between 500 and 580 nm. In some embodiments, the first device may include a second light source 802 may include one or more OLEDs that emit light that has a peak wavelength in the visible spectrum between 500 and 580 nm and a third light source (not shown) that may include one or more OLEDs that emit light that has a peak wavelength in the visible spectrum between 580 and 700 nm. The second 802 and third light source may disposed over one another, as illustrated in FIG. 4, or the light emitting devices of the second 802 and third light sources may be disposed over the intervening substrate 804 so as to be physically separate, as shown in FIGS. 6 and 7.

Continuing with the description of the exemplary embodiment shown in FIG. 8, the first device may also include an optical component. Preferably, the optical component (not shown) may be disposed between the first surface of the waveguide structure 811 and the intervening substrate 803, shown in FIG. 8 as 804. The optical component may include any one of, or some combination of, the following: an air space; a partial reflector; a diffuser; an index-matching fluid or solid layer; and/or an outcoupler.

In operation, light emitted from the first light source 801 is coupled into the optical waveguide structure 800. The waveguide structure is designed so as to emit a substantially uniform amount of the light emitted from the first light source per unit area of the emitting surface or surfaces. In FIG. 8, this emitting surface is shown as the second surface 811. The light emissions from the second 802 light source may propagate through the substrate 803 and through any optical component in space 804. Preferably, in part because the second light source 802 comprises OLEDs, the light emissions from these devices will not be coupled into the waveguide 800 but will propagate directly through the waveguide and the light emitting surface 811. The combined emissions from the first 801 and second 802 light sources may propagate in the direction shown by arrow 805, and may combine either in the waveguide or thereafter, such as after reflecting off of an illuminated surface.

Alternatively, and not shown in FIG. 8, the second light source 802 may emit light that substantially propagates in the direction away from the first surface 810 of waveguide structure 800. That is, the substantial amount of light emitted from this source does not propagate through the first 810 and second 811 surfaces of the waveguide, or through any optical component in space 804. In this embodiment, the first surface 810 of the optical waveguide may be a light emitting surface. The substrate may comprise a transparent material, such as glass or plastic. The second light source 802 may comprise one or more TOLEDs, such that the light emitted by the first light source 801 and is also emitted from the waveguide emitting surface 810 may propagate substantially through the second light source 802. Alternatively, and also not shown in FIG. 8, the first 810 and second 811 surfaces of the waveguide may be light emitting surfaces, and the second light source 802 may emit light that propagates in both the direction shown by arrow 805 and the direction substantially away from waveguide 800. In this embodiment, the second light source 802 may be TOLEDs and the substrate 803 may comprise transparent materials.

In addition to the general advantages provided by the embodiment that includes only a second light source (discussed in relation to FIG. 5) or the advantages provided by an the embodiment that includes both a second and third light source (discussed in relation to FIG. 4), the exemplary embodiment shown in FIG. 8 offers additional advantages. This may include a decrease in fabrication costs, based in part on the fact that the OLEDs may be located on a separate substrate and thereby not deposited directly onto the waveguide surface. Moreover, this may permit easier repair of the device if a problem occurs only in the OLEDs and/or substrate, as only that part of the device will have to be replaced (i.e. the waveguide and first light source may not have to be replaced). Additionally, the utilization of optical components in the space 804 between the substrate and the optical waveguide allows for better control and manipulation of the light emitted from the OLED devices. For instance, a diffraction grating or other modifier may be placed in area 804 to improve the optical outcoupling from the OLEDs.

Figure 9:
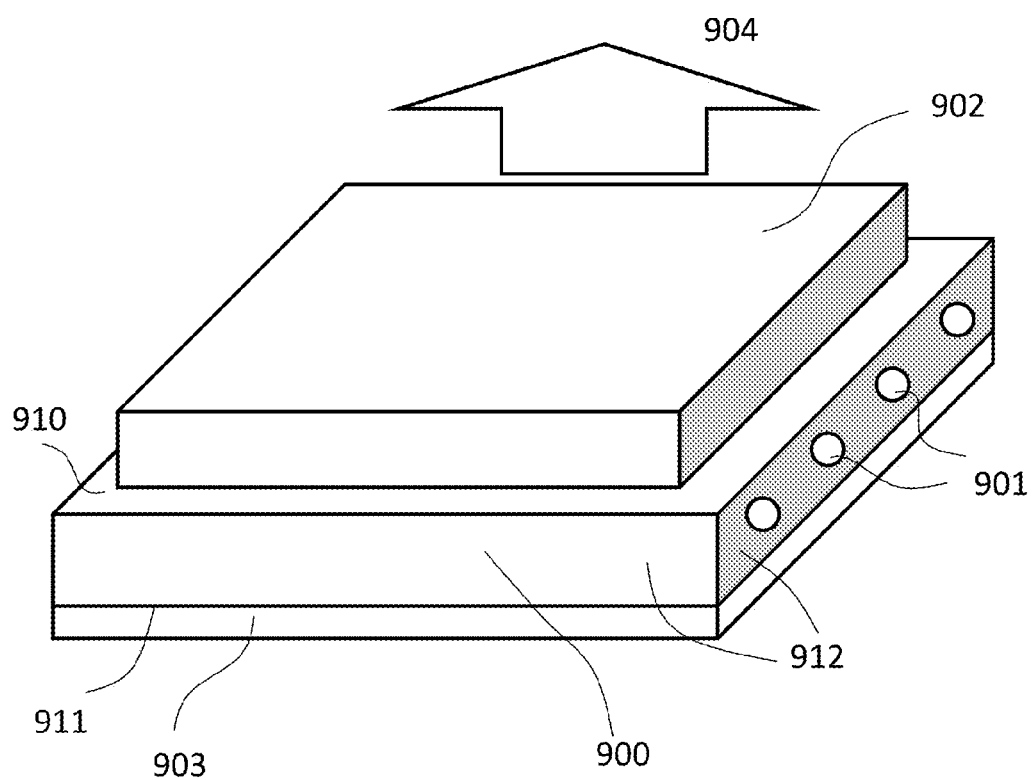
FIG. 9 shows an exemplary embodiment of a first device that includes a waveguide.

FIG. 9 shows an exemplary embodiment of the first device. The first device includes a first light source 901, a second light source 902, and an optical waveguide structure 900. The first light source 901 may include one or more LEDs that emit light having a peak wavelength in the visible spectrum between 400 and 500 nm. The second light source 902 may include one or more OLEDs that may emit light that has a peak wavelength in the visible spectrum between 500 and 800 nm. As shown in FIG. 9, the second light source 902 includes one or more TOLEDs, such that light 904 may propagate through the second light emitting devices relatively unimpeded. Although specifically identified as a transparent OLED (TOLED) in this embodiment, as noted above any reference to an OLED as a light emitting device also includes TOLEDs. As shown in FIG. 9, at least some of the light that is emitted from the second light source 902 propagates away from the waveguide 900. In this exemplary embodiment, at least a portion of the light emitted from the first light source 901 propagates through the second light source 902. The light propagation direction is shown by arrow 904.

The optical wave guide structure 900 include a first surface 910 and a second surface 911. The first surface 910 is opposed to the second surface 911. The optical waveguide structure 900 may also include one or more edge surfaces 912. The first light source 901 may be coupled to the optical waveguide so that the first light source 901 emits light into the optical waveguide structure 900. At least one of the surfaces of the optical waveguide is a light emitting surface. In FIG. 9, the first surface 910 is shown as an emitting surface. Preferably, the optical waveguide structure is configured to emit a substantially uniform amount of blue light per unit of surface area of the emitting surface 910.

Continuing with the exemplary embodiment in FIG. 9, the second surface 911 of the waveguide may comprise a reflector 903. Alternatively, the second surface 911 of the waveguide may comprise a light emitting surface such that a portion of the light emitted from the first 901 and the second light 902 sources passes through the second surface 911. In this case, the entire panel would be partially transparent when turned off.

The second light source 902 is disposed over the first surface 910 of the waveguide 900. In some embodiments, the second light source 902 may include one or more OLEDs that emit light that has a peak wavelength in the visible spectrum between 550 and 600 nm. In some embodiments, the second light source 902 may include one or more OLEDs that emit light that has a peak wavelength in the visible spectrum between 500 and 580 nm. In some embodiments, the first device may include second light source 902 that may include one or more OLEDs that emit light that has a peak wavelength in the visible spectrum between 500 and 580 nm and a third light source (not shown) that may include one or more OLEDs that emit light that has a peak wavelength in the visible spectrum between 580 and 700 nm. The second 902 and the third light sources may be disposed over one another, as illustrated in FIG. 4, or the light emitting devices of the second 902 and third light sources may be disposed over the first surface 910 of the waveguide 900 so as to be physically separate, as shown in FIGS. 6 and 7. The second and/or third light emitting devices may be disposed directly on the first surface of the wave guide using any suitable deposition technique including those mentioned above. Alternatively, the second and/or third light emitting devices may be disposed or grown on a separate substrate and the laminated to the first surface of the waveguide, or attached in any suitable manner.

In operation, light emitted from the first light source 901 is coupled into the waveguide 900. The waveguide is designed so as to emit a substantially uniform amount of the light emitted from the first light source per unit area of the emitting surface or surfaces. In FIG. 9 this is the first surface 910. The combined emissions from the first and second light sources may propagate in direction 904. Thus, in this embodiment, the light emissions from the first light source 901 may propagate out of the waveguide surface 910 and through second light source 902.

In addition to the advantages discussed with respect to FIG. 5, the embodiment shown in FIG. 9 offers several advantages. For instance, light emission may be in more than one direction. Also, the light from the LEDs, after it has been diffused by the waveguide and emitted from the emitting surface, passes through the transparent OLED (TOLED) devices. This permits the emissions from the light sources to combine at the source, thereby appearing white at the first device (that is, a viewer when looking at the first device would not see the different emissions). This may also alleviate the need for a diffuser to combine the emissions into white light.

In various embodiments, the LEDs not integrated with the OLED at all, but the light from the LED and the OLED still combine. For instance, the first device may include one or more blue LEDs disposed such that their emissions combine with the emissions from one or more OLEDs, where the LED and the OLEDs are disposed on a separate substrate. Each of the OLEDs may also be disposed on a separate substrate from the some or all of the other OLEDs. FIGS. 10 and 11 illustrate exemplary embodiments. In general the blue LEDs and the yellow or red and green OLEDs may be disposed relative to each other in any manner, so long as their emissions combine to comprise white light at a location, which is typically at some distance away from the first device but before an illumination surface.

FIG. 10 shows an exemplary embodiment of a first device. The exemplary embodiment includes a first light source 1001, a second light source 1002, and a third light source 1003. The first light source may include one or more LEDs that emit light having a peak wavelength in the visible spectrum between 400 and 500 nm. The second light source may include one or more OLEDs that emit light that has a peak wavelength in the visible spectrum between 500 and 580 nm. The third light source may include one or more OLEDs that emit light that has a peak wavelength in the visible spectrum between 580 and 700 nm.

The exemplary embodiment shown in FIG. 10 also includes a first and second substrate (not shown). The second light source 1002 may be disposed on the first substrate, the third light source 1003 may be disposed on the second substrate, and the first light source 1001 may not or may not be disposed on the first or the second substrate. As illustrated in FIG. 10, the first light source 1001 is not disposed on either the first or the second substrates. Embodiments may also include either one of, or some combination of a lens 1004 and a reflector 1005. More preferably, the first device may comprise both a lens 1004 and a reflector 1005, where the first 1001, the second 1002, and the third 1003 light sources are disposed between the lens 1004 and the reflector 1005. The lens and/or reflector may be used to control the direction and the amount of light that is propagated by the first device. Moreover, additional optical components may also be included. The advantages of this embodiment may include that the fabrication processes for each color are decoupled (because they are on different substrates), which may result in reducing manufacturing cost and reducing the concern over manufacturing issues such as the encapsulation process for one component affecting one of the other components. However, the separate components must then be assembled, and the devices may require additional hardware to mix the light.

FIG. 11 shows a exemplary embodiments of a first device, which includes a first light source 1101 and a second light source 1102. The first light source may include one or more LEDs that emit light having a peak wavelength in the visible spectrum between 400 and 500 nm. The second light source 1102 may include one or more OLEDs that emit light that has a peak wavelength in the visible spectrum between 500 and 700 nm. Preferably the OLEDs of the second light source 1102 emit light that has a peak wavelength in the visible spectrum between 550 and 600 nm. The exemplary embodiment shown in FIG. 11 includes a first substrate (not shown). The second light source 1102 may be disposed on the first substrate, and the first light source 1101 may or may not be disposed on the first substrate. As shown in FIG. 11, the first light source 1101 is not disposed on the first substrate. Preferably, the first light source 1101 is disposed at a location in the propagation direction of light emitted from the second light source. However, so long as the light emitted from the first and second light emitting devices is coupled, they may be located in any way relative to the other.

Embodiments may also include either one of, or some combination of a lens 1104; and a reflector 1105. More preferably, the first device may comprise both a lens 1104 and a reflector 1105, where the first 1101 and the second 1102 light sources are disposed between the lens 1104 and the reflector 1105. The lens and/or reflector may be used to control the direction and amount of light that is propagated by the first device. Moreover, additional optical components may also be included.

The embodiments shown in FIGS. 10 and 11, while not having some of the advantages that use of a waveguide may provide, do offer other advantages. First, fabrication costs are likely to be reduced, as the OLEDs may be located on separate substrates and thus do not have to be deposited on a single substrate. Moreover, these configurations offer greater flexibility, as the light emitting devices may be located in any relation to on another, and are not thereby confined to use within a waveguide structure. There may also be reduced risks of damage and/or malfunction related to the deposition of multiple different components on a single substrate, such as the encapsulation process for one component affecting or damaging one of the other components.

FIG. 12 shows two exemplary embodiment of a first device, which includes a first light source 1201 and a second light source 1202, and a substrate 1200. The first light source may include one or more LEDs that emit light having a peak wavelength in the visible spectrum between 400 and 500 nm. The second light source may include one or more OLEDs that may emit light that has a peak wavelength in the visible spectrum between 500 and 700 nm. As shown in FIG. 12(a), the second light source may include one or more OLEDs that may emit light that has a peak wavelength in the visible spectrum between 550 and 600 nm (yellow).

In some embodiments, the substrate 1200 may substantially surround the first light source 1201. As shown in FIG. 12(a), the second light source 1202 may be disposed over a surface of the substrate 1200. In some embodiments, the substrate 1200 is a patterned substrate and the second light source 1210 includes one or more TOLEDs. FIG. 12 (b) shows an exemplary embodiment where the first device further includes a third light source 1203. The third light source may include one or more OLEDs that emit light that has a peak wavelength in the visible spectrum between 580 and 700 nm. The second 1202 and third 1203 light sources are disposed on the substrate 1200.

In addition to some of the advantages identified for FIGS. 10 and 11, the embodiments disclosed in FIG. 12 offer the advantage of providing an esthetically pleasing configuration. As depicted in FIG. 12, the LEDs and the OLEDs located on the substrate are in a configuration like a traditional lamp shade. Moreover, while depicted as cylindrical, the substrate have the form of any geometric shape.

In some embodiments, the first device as described above may include a heat protective element configured to reduce the amount of heat generated by the first light source that reaches the second light source. The heat protective element may be configured to significantly reduce the amount of heat generated by the first light source that reaches the second light source. One way to determine the reduction in the amount of heat that reaches the second light source from the first light source is by using a test comprising two devices. "Device A" includes the heat removal element, whereas "device B" does not. Devices A and B both comprise a first and second light source. The first light source may include one or more LEDs that emit light having a peak wavelength in the visible spectrum between 400 and 500 nm. The second light source may include one or more OLEDs. The OLEDs that comprise the second light source may emit light that has a peak wavelength in the visible spectrum between 500 and 800 nm.

Devices A and B are both tested in two modes of operation: in the first mode, only the second light source is emitting; in the second mode, both the first and second light sources are emitting. The temperature at the second light source is measured for both modes of operation and compared. This gives a difference in heat ($\Delta$) between the two operating modes. The $\Delta$ for "device A" can then be compared to the $\Delta$ of "device B" to determine the amount of reduction in heat from the first light source that reaches the second light source caused by the heat protective element. A substantial amount of heat may be defined as a reduction by at least half of the heat that reaches the second light source from the first light source.

As noted above, LEDs have a junction temperate that may be much higher than the operating temperature of an OLED. Given that many embodiments, including those that may use a waveguide, may place the LEDs and OLEDs in relatively close proximity, having heat removal may provide the advantage of preventing heat related damage to the OLEDs and provide for a longer operating life time.

The heat protective element may include a dielectric reflector that is coupled to one or more of the first light emitting devices of the first light source such that the light emitted from the first light emitting devices propagates through at least a portion of the dielectric reflector. The heat protective element may include cooling fins or it may include an active heat removal device. The active heat removal device may be configured to remove heat away from the second light emitting devices. It may be preferred in some embodiments that the active heat removal device includes either one of, or some combination of thermoelectric coolers and/or a forced fluid cooling system. Any other method known in the art may be used to remove heat away from the second and/or third light emitting devices of the second and/or third light source.

In some embodiments, the first device as described above may include a heat protective element that comprises a heat distribution element that is configured to distribute heat evenly over the surfaces of the OLEDs of the device. The heat distribution element may be configured to distribute heat so as to maintain a substantially uniform current injection in the OLED devices. This offers important advantages in uniformity of light emission from the OLED devices, as the amount of current injected into these devices can vary with the temperature of the device. Therefore, effectively distributing heat may maintain uniformity in the light emitted from the OLED light sources. A second advantage is that the operating lifetime of OLEDs decreases at elevated temperatures, so the uniform temperature prevents differential aging of different areas of the OLED structures, which may become aesthetically unpleasing with time. For instance, this may prevent parts of the OLED from developing as hotter, which may degrade faster than other parts of an OLED.

In some embodiments, the first device comprises a first light source, a second light source, and an electronic driving component. The first light source may include one or more inorganic LEDs that emit light having a peak wavelength in the visible spectrum between 400 and 500 nm. The second light source may include one or more OLEDs that emit light that has a peak wavelength in the visible spectrum between 500 and 800 nm. The electronic driver component may control the current supplied to the OLEDs and the LEDs to maintain color control (e.g. maintain the CCT) as the brightness of the first device is varied. Preferably, the first device may comprise a plurality of separate driver components for the LEDs and the OLEDs. Such electrical driver components may use, for instance, circuitry, a look-up table, or ASIC to control the current supply. Preferably, multiple OLEDs may be driven in series. Alternatively, sets of OLEDs may be electrically connected in parallel, and the sets of OLEDs may be linked in series and controlled by a driving component.

In some embodiments, the control circuitry can adjust the current flowing to the LEDs and/or the OLEDs to provide a specific luminance and CCT value, based, in part, on combining the known light output characteristics (including luminance and CCT) of the light emitting devices as a function of drive current. The control circuitry may thereby, in effect, determine the combination of light from two sources, such as the LED devices and OLED devices, so as to provide the desired overall light output when the emissions are combined.

In some embodiments, the driving component may be configured to independently control the current supplied to at least one OLED and at least one LED in response to a single input. A single input may be from a user input (e.g. by a user selecting a first luminance level of the device) or may be determined automatically such as by the use of sensors, which collect data and calculate the amount of light emissions required from each light source and/or each light emitting device. As described above, the characteristics of the OLED and LED devices, and in particular the relation between the drive current supplied to the device and the voltage across each device, may be different. Thus, in some embodiments, the current supplied by the drive component to at least one OLED and at least one LED may not be linearly related, patricianly as the input level is changed.

In some embodiments, the input that affects or controls the drive current supplied by the driving component or components may have at least three different levels. For example and illustration purposes only, there may be a "low" input level (corresponding to an initial luminance level), a "medium" input level (corresponding to a higher luminance level), and a "high" luminance level (corresponding to the highest luminance level). In some embodiments, the input may be continuously variable, such as when a "knob" that may be rotated by a user to vary the desired luminance level of the device. The variable input levels may provide mood lighting, which may in some embodiments change the CIE of the combined emissions as the input level is changed. In some embodiments, it may be desirable to maintain the CIE coordinate of the combined emissions as the input level is varied (such as to maintain a white light source for the device). The drive component may be configured to vary the drive current supplied to each of the OLED and LED light emitting devices accordingly, such that their combined emissions achieve the desired luminance characteristics.

For example, in some embodiments where the driving component is configured to independently control the current supplied to at least one OLED and at least one LED in response to a single input, the driving component may also be configured to control the current supplied to the LED and OLED such that the combined light emissions of the first device maintain a constant CIE coordinate for all levels of input. Again, this may be desirable for maintaining a consistent color light source, but changing the luminance level such as by dimming the device.

Another example is that, in some embodiments, the driving component may be configured to control the current supplied to the LED and OLED so as to maintain a color correlated temperature (CCT) for the combined light emissions of the first device as the brightness of the first device is varied. This may be desirable, for instance, to compensate for the aging of the device as it is used. As the individual light emitting devices age, their luminance may decrease for a given drive current, and the drive component may thereby compensate for this decrease by increasing the drive current to maintain the same CCT value over time.

In some embodiments, the driving component is configured to control the current supplied to the LED and OLED such that the combined light emissions of the first device has a CIE coordinate that moves along the CCT line as the input varies. This may be desirable for certain applications such as mood lighting, where it is desired that the luminance characteristics of the combined emissions vary as the input changes. The driving component may control the drive current supplied to the OLEDs and LEDs using any known manner, including the use of any one of, or some combination of circuitry, a look-up table; and application-specific integrated circuits (ASIC).

In some embodiments, the electronic driving component or components may control the current to the various elements such that the CCT of the combined light source decreases as the total light output is reduced. In some embodiments, it may be preferred that at least one LED and at least one of the OLEDs are driven in series using a single driving component that controls the current. Although this may make it difficult to tune the ratio of the individual elements (e.g. the OLED and LED), it simplifies the system and reduces costs. In addition, because LEDs generally fail open, whereas OLEDs fail short, failure of the LED will result in the entire lamp segment controlled by that driver going dark whereas failure of the OLED will result in a color shift of the segment away from white. To protect against the latter case of the OLED failure, it may be necessary to add a fuse, which will open the electrical connection if a short occurs in the OLED device.

Preferably, the intensity of the OLED or the LED may be controlled either by controlling the magnitude of the drive current or by using pulse width modulation (PWM), which basically controls the duty cycle of pulsed current delivered to the device. PWM is commonly used to control the brightness of LEDs but is not used as often in OLEDs.

In some embodiments, the driving component or components are configured to determine any one of, or some combination of a luminance level of the first device and/or a CCT value of the first device. This may be done by, for example, using any type of optical or photosensitive sensor located within the device or in operative communication with the device and/or its light emissions. Preferably, the plurality of driving components are configured to provide an amount of current to the first and/or the second light sources based on either one of, or some combination of the determined luminance level and/or the determined CCT value. That is, for instance, if the OLED devices are not supplying a sufficient amount of light emission such that, when combined with the light emission from the LED devices, a desired CCT or luminance level is achieved, the driving component or components may vary the amount of current provided to the OLED devices to alter the luminance level and other characteristics of the light emitting devices. This may provide the ability for the first device to adapt to changes in the light emissions of one or more components as the components (such as the individual OLEDs and LEDs) of the first device change over time. This may also provide the ability to adapt to sudden changes that may occur (or any other changes in the device and its light emissions), such as, for instance, if some of the OLED or LED light emitting devices in a first device fail. Similarly, the driving components may vary the current to other light emitting devices (such as the LED devices) as needed.

In some embodiments, the first device comprises a plurality of driving components and the second light source may comprise a plurality of OLED devices. The first device may comprise a first set of OLED devices that includes a portion of the plurality of OLED devices. Each of the OLED devices in the first set of OLED devices may be electrically connected in parallel. Although as noted above when an OLED fails, it typically fails short (and thereby all such current may flow through the one of the OLED devices connected in parallel), this may be offset by using a fuse. The first device may include a second set of OLED devices that includes a portion of the plurality of OLED devices. Each of the OLED devices in the second set of OLED devices may also be electrically connected in parallel. The first set and the second set of OLED devices may be electrically connected in series such that the first set and the second set of OLED devices are controlled by one driving component. By utilizing such a configuration, it may reduce manufacturing costs and complexity because only one driving component is needed to control the current supplied to (and in turn the light emission characteristics of) a plurality of OLED devices. However, it should be understood that any combination of light emitting devices connected in any combination of parallel and/or series electrical connections may be used.

Experimental Simulation for Selected Components

The inventors have created experimental simulations for an LED and an OLED to demonstrate the differences in some of the characteristics of these devices, as were described above. These simulations were performed using known data for a commercially available LED and an OLED (referred to as Red Dye 1).

For the simulations conducted by the inventor, a Blue LED having a peak wavelength of approximately 450 nm (which is commercially available, as indicated by Osram) and Red Dye 1 (as noted above), which had the following chemical structure:

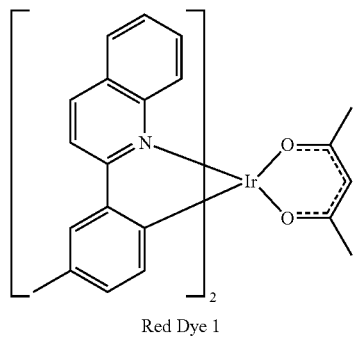

Red Dye 1

The results are shown in FIG. 13, with the OLED shown in 1301 and the LED as 1302. It should be understood that these results are designed to be for illustration purposes only and are only meant to represent the general behavior of OLED and LED devices. It should be understood that the characteristics of each OLED and LED may vary based on many factors. However, generally an OLED will be less linear on a semi-log scale (i.e. exponential scale) than an LED, and therefore the change in brightness with voltage will be different. Thus, in some embodiments, the driving component or components may need to compensate for these differences by supplying different currents to each type of light emitting device, and the drive current supplied to each may not be linearly related.

It is understood that the various embodiments described herein are by way of example only, and are not intended to limit the scope of the invention. For example, many of the materials and structures described herein may be substituted with other materials and structures without deviating from the spirit of the invention. The present invention as claimed may therefore includes variations from the particular examples and preferred embodiments described herein, as will be apparent to one of skill in the art. It is understood that various theories as to why the invention works are not intended to be limiting.

The invention claimed is:

1. A first device comprising:
a first light source comprising one or more first light emitting devices, each of the first light emitting devices comprising an inorganic light emitting diode (LED) that emits light that has a peak wavelength in the visible spectrum between 400 and 500 nm; and
a second light source comprising one oi more second light emitting devices, each of the second light emitting devices comprising an organic light emitting diode (OLED) that emits light that has peak wavelength in the visible spectrum between 500 and 800 nm;
a driving component;
a heat protective element, wherein the heat protective element is configured to reduce the amount of heat generated by the first light source that reaches the second light source;
wherein the first light source and the second light source are disposed such that their emissions combine;
wherein the driving component is configured to independently control the current supplied to at least one OLED and at least one LED in response to a single input, wherein the current supplied to the OLED and the LED is not linearly related; and
wherein the driving component is configured to control the current supplied to the LED and OLED such that the combined light emissions of the first device maintain a constant CIE coordinate for all levels of input.

2. The device of claim 1, wherein the first device is either a lamp, a fixture, or a luminaire.

3. The device of claim 1, wherein the heat protective element is configured to significantly reduce the amount of heat generated by the first light source that reaches the second light source.

4. The device of claim 1, wherein the heat protective element comprises a dielectric reflector; wherein the dielectric reflector is coupled to the first light emitting devices of the first light source such that the light emitted from the first light emitting devices propagates through at least a portion of the dielectric reflector.

5. The device of claim 1, wherein the heat protective element comprises cooling fins.

6. The device of claim 1, wherein the heat protective element comprises an active heat removal device; and wherein the active heat removal device is configured to remove heat away from the second light emitting devices.

7. The device of claim 6, wherein the active heat removal device comprises either one of, or some combination of: a thermoelectric coolers; or a forced fluid cooling system.

8. The device of claim 1, further comprising: a heat distribution element configured to distribute heat evenly over the surfaces of the OLED devices.

9. The device of claim 8, wherein the heat is distributed so as to maintain substantially uniform current injection in the OLED devices.

10. The device of claim 1, wherein the input may have at least three different levels.

11. The device of claim 1, wherein the driving component is configured to control the current supplied to the LED and OLED so as to maintain a color correlated temperature (CCT) for the combined light emissions of the first device as the brightness of the first device is varied.

12. The device of claim 1, further comprising: a plurality of driving components, wherein each of the plurality of driving components is configured to control the current supplied to at least one LED or OLED.

13. The device of claim 12, wherein the plurality of driving components are configured to control the current supplied by using any one of, or some combination of: circuitry; a look-up table; or application-specific integrated circuits (ASIC).

14. The device of claim 12, wherein the plurality of driving components are configured to control the intensity of an LED or OLED by any one of, or some combination of: controlling the current to the LED or OLED; or using pulse width modulation (PWM).

15. The device of claim 12, wherein the plurality of driving components are configured to determine any one of, or some combination of: a luminance level of the first device; and a CCT value of the first device.

16. The device of claim 15, wherein the plurality of driving components are configured to provide an amount of current to the first and the second light source based on either one of, or some combination of: the determined luminance level; and the determined CCT value.

17. The device of claim 12, wherein the second light source comprises a plurality of OLED devices electrically connected in series; and wherein the plurality of OLED devices are controlled by one driving component.

18. The device of claim 12, wherein the second light source comprises a plurality of OLED devices, farther comprising: a first set of OLED devices comprising a first portion of the plurality of OLED devices, wherein each OLED device in the first set of OLED devices is electrically connected in parallel; and a second set of OLED devices comprising a second portion of the plurality of OLED devices, wherein each OLED device in the second set of OLED devices is electrically connected in parallel; wherein the first set and the second set of OLED devices are electrically connected in series, and wherein the first set and the second set of OLED devices are controlled by one driving component.

19. The device of claim 1, wherein at least one LED and one OLED are electrically in series, and wherein the LED and the OLED are controlled by one driving component.

* * * * *